(12) United States Patent
Ogawa et al.

(10) Patent No.: US 9,341,791 B2
(45) Date of Patent: May 17, 2016

(54) OPTICAL MODULE, MANUFACTURING METHOD OF OPTICAL MODULE AND OPTICAL COMMUNICATION DEVICE

(75) Inventors: Tsuyoshi Ogawa, Kanagawa (JP); Kazuyoshi Yamada, Tokyo (JP); Takashi Mizoroki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 461 days.

(21) Appl. No.: 13/414,883

(22) Filed: Mar. 8, 2012

(65) Prior Publication Data

US 2012/0257852 A1    Oct. 11, 2012

(30) Foreign Application Priority Data

Apr. 7, 2011 (JP) ................. 2011-085707

(51) Int. Cl.
*G02B 6/12* (2006.01)
*G02B 6/42* (2006.01)

(52) U.S. Cl.
CPC ..... *G02B 6/4201* (2013.01); *H01L 2224/16225* (2013.01); *H01L 2224/48091* (2013.01); *H01L 2224/48227* (2013.01); *H01L 2224/48464* (2013.01); *H01L 2224/73265* (2013.01); *H01L 2924/3011* (2013.01); *H01L 2924/3025* (2013.01); *Y10T 29/49117* (2015.01)

(58) Field of Classification Search
None
See application file for complete search history.

(56) References Cited

U.S. PATENT DOCUMENTS

| 6,623,178 B1 * | 9/2003 | Sakurai et al. ................. 385/92 |
| 7,198,412 B2 * | 4/2007 | Hamasaki et al. .............. 385/88 |
| 7,438,481 B2 * | 10/2008 | Numata et al. ................. 385/88 |
| 2006/0039658 A1 * | 2/2006 | Furuyama et al. .............. 385/90 |

FOREIGN PATENT DOCUMENTS

| JP | 2000-349307 | 12/2000 |
| JP | 2010-237640 | 10/2010 |

* cited by examiner

*Primary Examiner* — Tina Wong
(74) *Attorney, Agent, or Firm* — Hazuki International, LLC

(57) ABSTRACT

An optical module includes: a substrate provided with a through hole for inserting an optical fiber from a second principal surface side of the substrate; an optical device provided on a first principal surface side of the substrate; a first electrode provided in the substrate for connecting an electric fiber from the second principal surface side; a second electrode formed on the first principal surface side of the substrate for connecting to the optical device; and a third electrode provided on a side surface of the substrate and electrically connected to the second electrode.

11 Claims, 17 Drawing Sheets

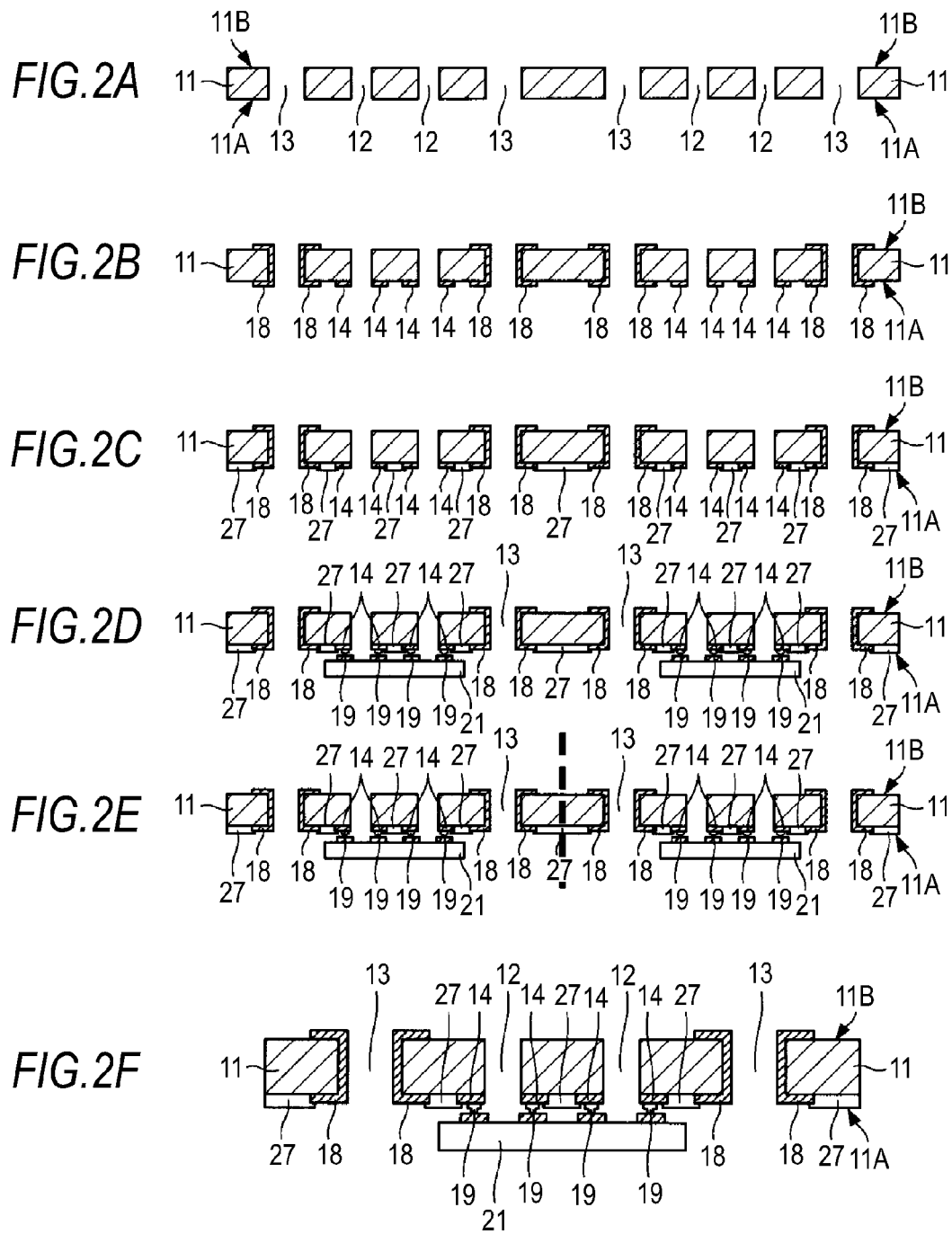

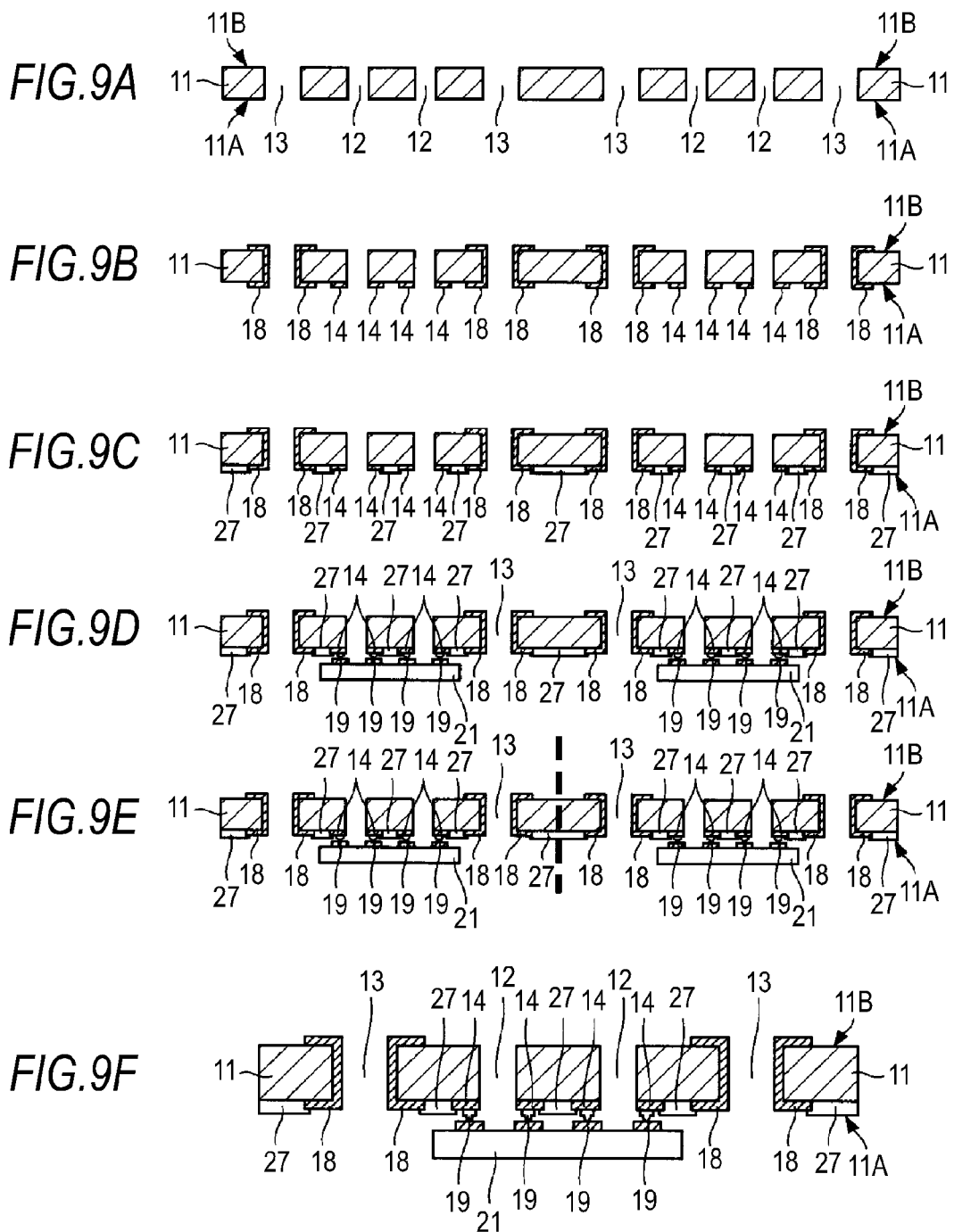

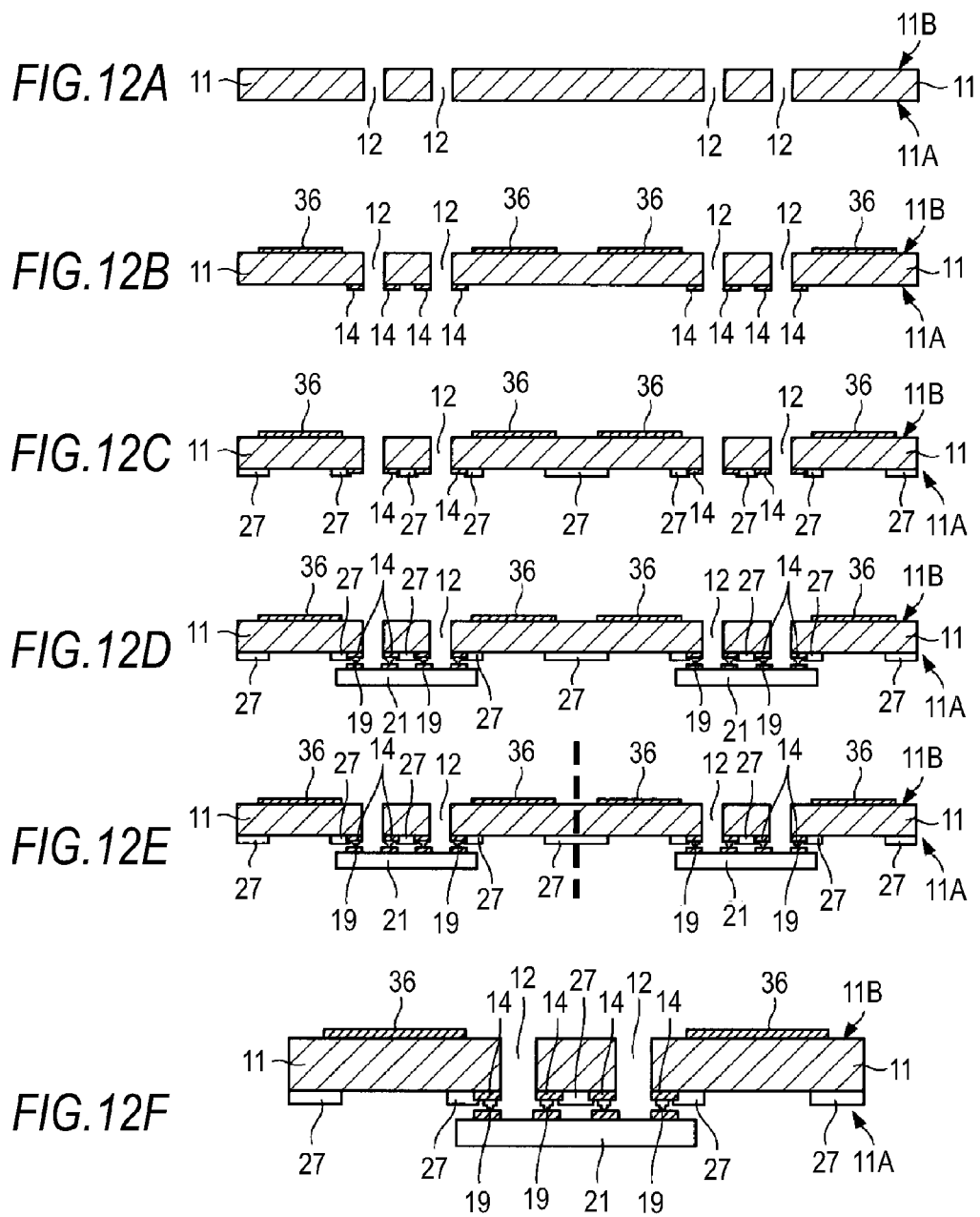

OPTICAL MODULE, MANUFACTURING METHOD OF OPTICAL MODULE AND OPTICAL COMMUNICATION DEVICE

FIELD

The present disclosure relates to an optical module, a manufacturing method of the optical module and an optical communication device used for optical communication and so on.

BACKGROUND

In recent years, as an information amount to be handled is increased, optical conductors (optical fibers and so on) are often used as information transmission paths. In this case, one end of the optical fiber is connected to a semiconductor device and so on for information processing through an optical module (for example, refer to JP-A-2000-349307 (Patent Document 1)). In this method, electrical connection between an optical device and the semiconductor device is directly performed by wire bonds.

Additionally, an optical module to which a photoelectric composite cable is connected is proposed as the optical module to which the optical fiber and an electric fiber for transmitting/receiving electric signals are connected (for example, refer to JP-A-2010-237640 (Patent Document 2)).

SUMMARY

When the photoelectric composite cable is connected to the optical module, it is necessary to connect the optical fiber to the optical device and further to connect the electric fiber to the optical device. As for electrical connection between the electric fiber and the optical device, direct soldering to the optical device, direct connection by wire bonds or connection using an electric connector and so on are used.

In optical connection between the optical device and the optical fiber, optical components such as a lens are necessary, which leads to a complicated optical system. Then, when light from the optical device is optically coupled to the optical fiber for assembly, highly accurate optical alignment will be necessary. The electrical connection between the electric fiber and the optical device and the optical connection between the optical fiber and the optical device are separately performed in the optical module, therefore, miniaturization of the device is difficult.

It is therefore desirable to provide an optical module and an optical communication device including the optical module which can be miniaturized when the photoelectric composite cable is connected.

An embodiment of the present disclosure is directed to an optical module including a substrate provided with a through hole for inserting an optical fiber from a second principal surface side of the substrate, an optical device provided on a first principal surface side of the substrate, a first electrode provided in the substrate for connecting an electric fiber from the second principal surface side, a second electrode formed on the first principal surface side of the substrate for connecting to the optical device and a third electrode provided on a side surface of the substrate and electrically connected to the second electrode.

Another embodiment of the present disclosure is directed to an optical communication device including the optical module, a circuit substrate on which the optical module is mounted and a driving device for the optical device to be mounted on the circuit substrate.

Still another embodiment of the present disclosure is directed to a manufacturing method of an optical module including: forming a through hole for inserting an optical fiber and a through hole for forming a third electrode in a substrate, forming a conductive layer in the substrate and inside the through hole for forming the third electrode, forming a first electrode for connecting the electric fiber and the second electrode for connecting a optical device in the substrate and forming a third electrode provided so as to continue from the second electrode inside the through hole for forming the third electrode, mounting the optical device on the second electrode, and cutting the substrate inside the through hole for forming the third electrode to allow the third electrode inside hole to be exposed on a side surface of the substrate.

In the above optical module, the optical fiber is inserted into the through hole provided in the substrate and the electric fiber is connected to the first electrode in the substrate when the photoelectric composite cable is connected. Accordingly, the photoelectric composite cable having the optical fiber and the electric fiber is connected to the optical module in the substrate of the optical module. Moreover, the electrode connecting to the optical device are electrically connected to the electrode on the side surface of the substrate. According to the structure, the structure for outputting/inputting electric signals of the optical device is not necessary at the outside of the optical module. Therefore, miniaturization of the optical module as well as miniaturization of the communication device on which the optical module is mounted can be realized.

According to the embodiments of the present disclosure, it is possible to provide the optical module and the optical communication device which can be miniaturized when the photoelectric composite cable is connected.

BRIEF DESCRIPTION OF THE DRAWINGS

FIGS. 2A to 2F are views for explaining a manufacturing method of the optical module shown in FIGS. 1A and 1B;

FIGS. 9A to 9F are views for explaining a manufacturing method of the optical module shown in FIGS. 7A and 7B;

FIGS. 12A to 12F are views for explaining a manufacturing method of the optical module shown in FIGS. 11A and 11B;

DETAILED DESCRIPTION

Hereinafter, embodiments of the present disclosure will be explained, however, the present disclosure is not limited to the following examples.

The explanation will be made in the following order.
1. First Embodiment of Optical Module
2. Manufacturing Method of Optical Module in First Embodiment
3. Second Embodiment of Optical Module
4. Manufacturing Method of Optical Module in Second Embodiment
5. Third Embodiment of Optical Module
6. Manufacturing Method of Optical Module in Third Embodiment
7. Embodiment of Optical Communication Device <1. First Embodiment of Optical Module>

Hereinafter, a specific embodiment of an optical module will be explained.

Figure 1A:
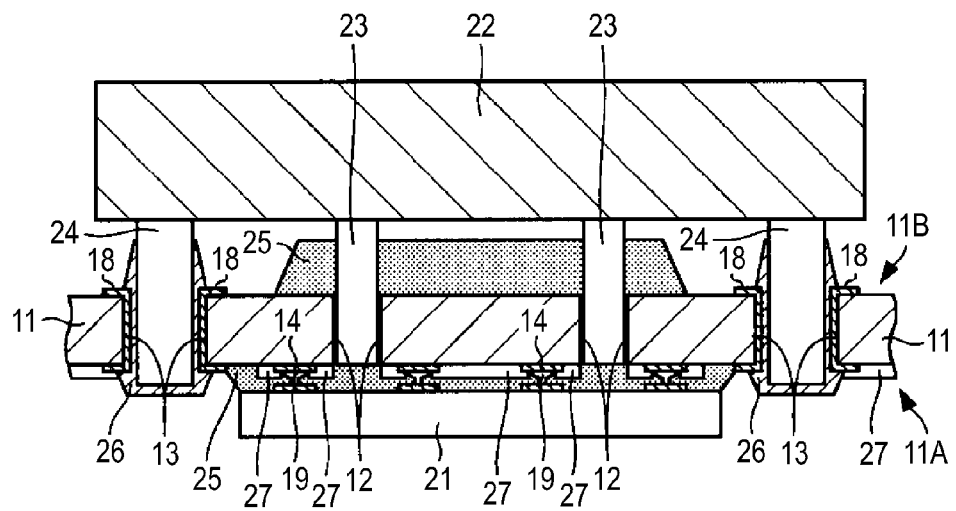
FIG. 1A is a cross-sectional view showing a structure of an optical module according to a first embodiment and FIG. 1B is a plan view showing the structure of the optical module according to the first embodiment.
Figure 1B:
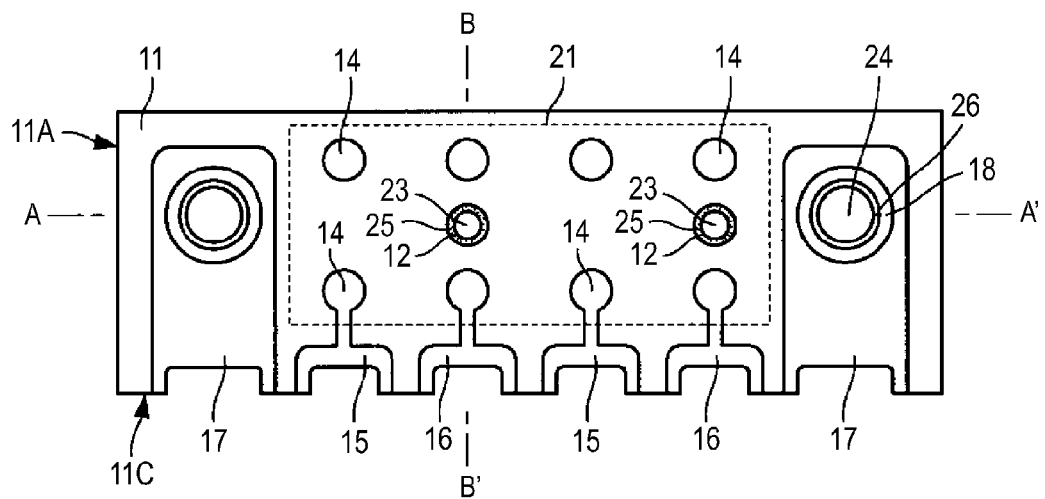

FIGS. 1A and 1B show schematic structural views of an optical module according to a first embodiment. FIG. 1A is a cross-sectional view of an optical module 10 and FIG. 1B is a plan view of a surface on which an optical device 21 of the optical module 10 is mounted. In FIG. 1B, only a position on which the optical device 21 is mounted is shown by broken lines.

The optical module 10 shown in FIGS. 1A and 1B includes a substrate 11 and the optical device 21 mounted on the substrate 11. The optical device 21 is mounted on a first principal surface 11A side of the substrate 11. A photoelectric composite cable 22 is connected from a direction of a second principal surface 11B side of the substrate 11. The photoelectric composite cable 22 includes optical fibers 23 for optical signals and electric fibers 24 for electric signals.

The optical device 21 is mounted so that a light emitting surface faces the substrate 11 in the case of a light emitting device and so that a light receiving surface faces the substrate 11 in the case of a light receiving device. In the optical module 10 shown in FIGS. 1A and 1B, the optical device 21 shows an example of an array device having two light emitting points or light receiving points. When the optical module 10 is used as an optical transmission module, an electric signal outputted from a not-shown information processing device is converted into an optical signal in the optical device 21 to emit light to the optical fibers 23. Another light receiving module is connected to the other end of the optical fibers 23.

For the substrate 11, insulating materials, for example, semiconductor substrates such as a silicon substrate, a quartz/glass substrate and a ceramic substrate as well as conductive materials are used. Particularly, silicon materials are preferably used for the substrate 11 because well-known semiconductor processes can be used and accurate processes can be achieved.

In the substrate 11, first through holes 12 and a second through holes 13 are formed. The first through holes 12 are holes for inserting the optical fiber 23 of the photoelectric composite cable 22. The second through holes are holes for inserting the electric fibers 24 of the photoelectric composite cable 22. First electrodes 18 for performing electrical connection to the electric fibers 24 are formed at inner faces of the second through holes 13.

Second electrodes 14 for connecting the optical device 21 are formed on the first principal surface 11A side of the substrate 11. The optical device 21 is mounted on the substrate 11 in a state where electrodes of the optical device 21 are connected to the second electrodes 14 by flip-chip mounting through conductive connection bumps 19. Here, the light emitting device and the light receiving device of the optical device 21 are planar-type devices. The light emitting device is, for example, a VCSEL (Vertical Cavity Surface Emitting Laser) and the light receiving device is, for example, a planar-type PD (Photo Detector). When the optical device 21 is the light emitting device, emitted light from the light emitting points of the optical device 21 is incident on the optical fibers 23. When the optical device 21 is the light receiving device, emitted light from the optical fibers 23 is incident on the light emitting points of the optical device 21.

Additionally, when the optical device 21 is flip-chip mounted on the substrate 11, positioning is performed so that the light emitting point or the light receiving point of the optical device 21 corresponds to the central position of the first through hole 12. An end face of the optical fiber 23 is arranged so as to be closed to the light emitting point or the light receiving point of the optical device 21.

The first through holes 12 are formed to have the size slightly larger than the size of the optical fibers 23 as well as formed so that positions of the optical fibers 23 inserted into the first through holes 12 are not irregular. That is, it is preferable that the difference between an opening diameter of the first through holes 12 and a diameter of the optical fibers 23 is small in a range in which the optical fibers 23 can be inserted smoothly.

As in the above structure when the light emitting point or the light receiving point is arranged so as to correspond to the central position of the first through hole 12, thereby allowing optical connection between the optical fibers 23 and the optical device to be good. Additionally, when the optical fibers 23 are inserted into the first through holes 12, the positioning between the optical device 21 and the optical fibers 23 can be performed as well as optical coupling efficiency between the optical device 21 and the optical fibers 23 can be increased easily.

An optical resin 25 approximately transparent with respect to a wavelength of light to be used is filled in a gap between the first principal surface 11A of the substrate 11 and the optical device 21 as well as in gaps in the first through holes 12 with respect to the optical fibers 23. Inner walls of the first through holes 12 and the optical fibers 23 are held by the optical resin 25, and the optical resin 25 exists between the optical device 21 and the optical fiber 23 without gap, therefore, good optical coupling can be achieved. Moreover, the optical resin 25 may be formed on the second principal surface 11B of the substrate 11 to held the optical fibers 23. Accordingly, the connection between the optical fibers 23 and the substrate 11 will be strengthened. For example, a thermosetting resin or a UV curing resin can be used as the optical resin 25.

The electric fibers 24 of the photoelectric composite cable 22 are inserted into the second through holes 13 of the optical module 10. The first electrodes 18 formed in the second through holes 13 and the electric fibers 24 from the photoelectric composite cable 22 are connected by a conductive material 26. The electric fibers 24 and the optical fibers 23 are connected to the substrate 11 respectively so as to be close to each other as shown FIGS. 1A and 1B, thereby improving connection strength between the optical module 10 and the photoelectric composite cable 22. Particularly, stress applied to the optical fibers 23 can be dispersed to the electric fibers 24 having higher strength which are closely connected for preventing breaking or detachment from the substrate 11 of the optical fibers 23 having lower strength.

The optical module 10 also includes third electrodes 15 and fourth electrodes 16 provided on a side surface 11C of the substrate 11 so as to continue from the second electrodes 14 on the first principal surface for performing electrical connection between the optical device 21 and an external device. Moreover, fifth electrodes 17 are also provided on the side surface 11C of the substrate 11 so as to continue from the first electrodes 18 formed inside the second through holes 13 for performing electrical connection between the electric fibers 24 of the photoelectric composite cable 22 and the external device.

The third electrodes 15, the fourth electrodes 16 and the fifth electrodes 17 are formed on the same side surface 11C of the substrate 11. The third electrodes 15, the fourth electrodes 16 and the fifth electrodes 17 are made of a conductive layer provided on the whole inner face of a concave portion formed on the side surface 11C of the substrate 11.

Electric signals from the third electrodes 15 and the fourth electrodes 16 are propagated to the second electrodes 14 on which the optical device 21 is mounted. Accordingly, when the optical device 21 is the light emitting device, electric signals from the third electrodes 15 and the fourth electrodes 16 are supplied to the optical device 21. Then, the electric signals are electrical-optical converted in the optical device 21 and optical signals are outputted from the optical device 21 to the optical fibers 23. When the optical device 21 is the light receiving device, optical signals emitted from the optical fibers 23 are received by the optical device 21 and optical-electrical converted in the optical device 21. Then, electric signals are outputted from the second electrodes 14 to the external device connected to the optical module 10 through the third electrodes 15 and the fourth electrodes 16.

Furthermore, an insulating layer 27 is formed on the first principal surface 11A, the second principal surface 11B, the side surface 11C and inner faces of the second through holes 13. Particularly, when the substrate 11 is made of the silicon substrate and the like, a not-shown insulating layer is formed at inner faces of the second through holes 13, and the first electrodes 18 are formed by the conductive layer formed over the insulating layer.

In the optical module 10 according to the first embodiment, the optical fibers 23 are connected to the first through holes 12 of the substrate 11 as well as the electric fibers 24 are connected to the second through holes 13 at the same time in the structure where the photoelectric composite cable 22 is connected. When using the structure of optical mounting, connection of light and electricity with respect to the optical module 10 can be made easily. It is also possible to realize miniaturization as compared with a structure of an optical module in related art in which optical fibers and electric fibers are connected at the same time.

The optical module 10 according to the first embodiment is shown by the example of using the photoelectric composite cable 22 having two optical fibers 23 and two electric fibers 24, however, the number of optical fibers 23 and the electric fibers 24 is not limited. The shape of the substrate, the pattern of the conductive layer and so on shown in FIGS. 1A and 1B are not limited to the above structure and various structures and patterns can be applied.

<2. Manufacturing Method of Optical Module in First Embodiment>

Next, a manufacturing method of the optical module according to the first embodiment will be explained with reference to FIGS. 2A to 2F and FIGS. 3A to 3F. FIGS. 2A to 2F correspond to cross-sectional views taken along A-A' line of the plan view of the optical module 10 shown in FIG. 1B. FIGS. 3A to 3F correspond to cross-sectional views taken along B-B' line of the plan view of the optical module 10 shown in FIG. 1B.

Figure 3A:
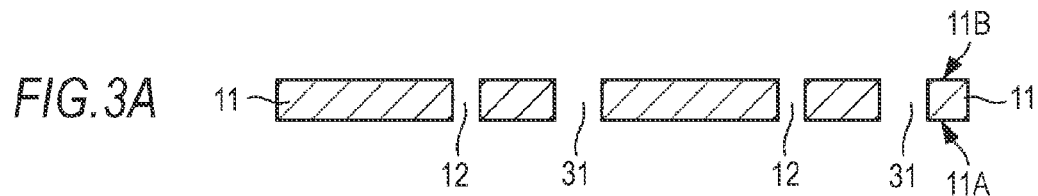
FIGS. 3A to 3F are views for explaining the manufacturing method of the optical module shown in FIGS. 1A and 1B.

First, as shown in FIG. 2A, the first through holes 12 and the second through holes 13 are formed in the substrate 11. At the same time, third through holes 31 are formed in the substrate 11 as shown in FIG. 3A.

As materials for the substrate 11, insulating materials, for example, semiconductor substrates such as the silicon substrate, the quartz/glass substrate and the ceramic substrate as well as conductive materials are used. When the substrate 11 is made of the silicon substrate, high-resistance silicon materials are preferably used for improving transmission characteristics of high-speed signals in electrodes and wiring formed on the substrate 11.

The first through holes 12 are formed at positions corresponding to connection portions of optical fibers. The second through holes 13 are formed at positions corresponding to connection portions of electric fibers. The third through holes 31 are formed at positions corresponding to the third electrodes 15, the fourth electrodes 16 and the fifth electrodes 17.

For example, methods of dry etching such as RIE (Reactive-Ion-Etching), wet etching and so on can be applied for forming the first through holes 12, the second through holes 13 and the third through holes 31. Anisotropic etching such as DRIE (Deep-Reactive-Ion-Etching) is particularly preferable.

The optical fibers are inserted into the first through holes 12. Here, the optical fibers are held inside the through holes with high accuracy, thereby securing stability in the optical coupling efficiency between the optical fibers and the optical device. Accordingly, it is preferable that the difference between the opening diameter of the first through holes 12 and the diameter of the optical fibers is small. When the difference between the opening diameter of the first through holes 12 and the diameter of the optical fibers is small, the accuracy of holding the optical fibers in the holes can be improved.

Figure 6A:
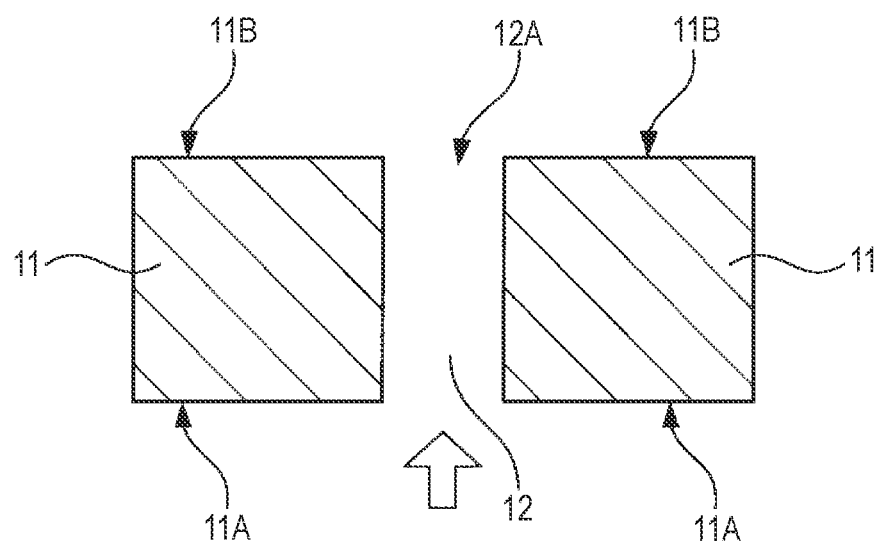
FIGS. 6A and 6B are views for explaining the manufacturing method of the optical module shown in FIGS. 1A and 1B.
Figure 6B:
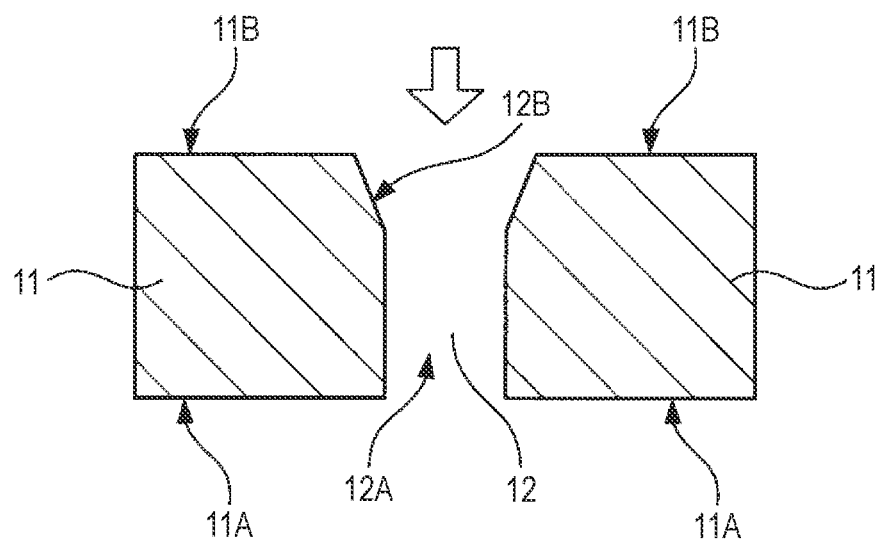

On the other hand, when the difference between the opening diameter of the first through holes 12 and the diameter of the optical fibers is small as described above, there is a case where it is difficult to insert the optical fibers into the first through holes 12. Accordingly, for example, as shown in FIG. 6A, anisotropic etching is performed from a direction of the first principal surface 11A of the substrate 11 (surface opposite to the surface from which the optical fibers are inserted) by using, for example, DRIE under a condition where vertical inner faces are formed as a first etching process. A first through hole 12A having a vertical inner face is formed by the first etching process. Next, the substrate 11 is etched in the vicinity of inlets into which the optical fibers are inserted from a direction of the second principal surface 11B of the substrate 11 (surface from which the optical fibers are inserted) by using, for example, DRIE under a condition of isotropic etching as a second etching process. A first through hole 12B in which an opening is widened is formed on the second principal surface side in the vicinity of the inlet into which the optical fiber is inserted by the second etching process as shown in FIG. 6B.

As described above, the first through hole 12 can be formed by the first etching process in which the vertical first through hole 12A is formed and the second etching process in which the first through hole 12B the opening of which is widened toward the insertion side is formed. According to the method, it is possible to easily perform insertion of the optical fiber when inserting the optical fiber, as the first through hole 12B on the inlet side is formed to be wider by the second etching process. Moreover, the vertical through hole 12A is formed in the inner face of the first through hole 12 by the first etching process, therefore, the accuracy of holding the optical fiber 23 can be maintained to be high.

The second through holes 13 may be formed only by using the above first etching process. Also in the first through holes 12, the above second etching process is not inevitable, which can be appropriately added in consideration of workability and the like in connection of the photoelectric composite cable.

Figure 3B:
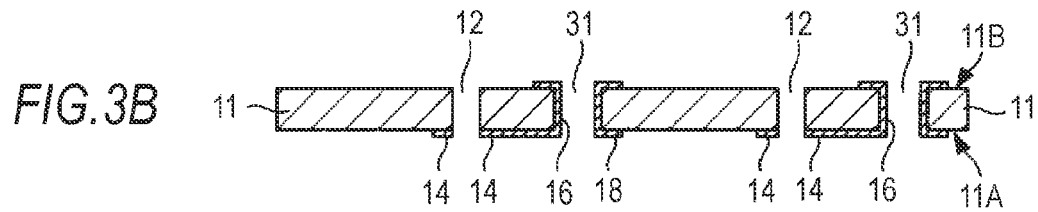

Next, the conductive layer is formed at given positions on the first principal surface 11A of the substrate 11 and inner faces of the second through holes 13 and the third through holes 31 as shown in FIG. 2B and FIG. 3B. The conductive layer is formed only on wall surfaces in the second through holes 13 and the third through holes 31 without filling the through holes.

The conductive layer is formed in the substrate 11, for example, by using copper and the like, then, a plating layer made of gold or the like is formed on the surface for protecting the conductive layer from oxidation and the like. The conductive layer may also be formed by using plating methods such as an electroless plating method, an electrolytic plating method or well-known methods such as sputtering and deposition. Here, the through holes are not filled with the conductive layer, therefore, the gold plating layer can be formed on the surface of the conductive layer exposed in the through holes.

The second electrodes 14 are formed on the first principal surface 11A of the substrate 11 by the process. At the same time, the first electrodes 18 are formed at inner faces of the second through holes 13 and the fourth electrodes 16 are formed at inner faces of the third through holes 31. The conductive layer is formed also in the third through holes 31 at positions corresponding to the third electrodes 15 and the fifth electrodes 17 at the same time as the fourth electrodes 16 in the third through holes 31.

When the substrate 11 is the semiconductor substrate such as the silicon substrate or a conductive substrate, a process of forming an insulating layer on the surface of the substrate 11 is added before the process shown in FIG. 2B and FIG. 3B for preventing, for example, short circuit in wiring and for improving signal transmission characteristics. As the process of forming the insulating layer, for example, a process of forming an oxide film ($SiO_2$ in the case of the silicon substrate) by thermal oxidation, a process of forming a SiN film by a CVD method, a process of adding an insulating film made of resin and the like on the surface or the like can be applied.

Figure 3C:
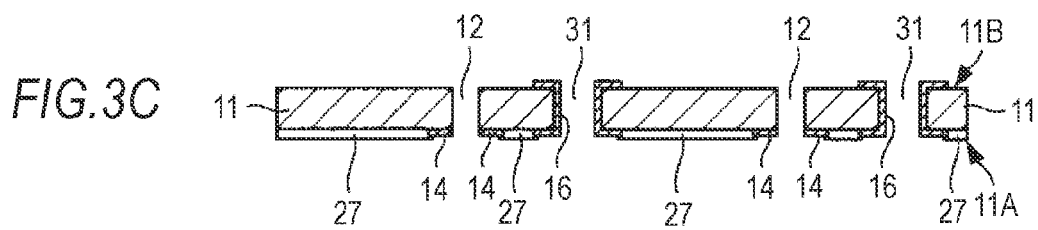

Next, as shown in FIG. 2C and FIG. 3C, the insulating layer 27 is formed so as to cover desired positions on the first principal surface 11A of the substrate 11. As the insulating layer 27, for example, insulating materials such as polyimide, epoxy and silicon materials are used. When the insulating layer 27 is made of a photosensitive material, patterning by a lithography process is performed after the surface of the substrate 11 is covered by coating of liquid materials or film materials. When the insulating layer 27 is made of a non-photosensitive material, the surface of the substrate 11 is coated by the non-photosensitive material, then, the non-photosensitive material is etched to form a desired pattern.

Though the insulating layer 27 is not an inevitable component, it is preferable to provide the insulating layer 27 as protection of wiring as well as stability in signal transmission characteristics of wiring can be secured by providing the insulating layer 27.

Figure 3D:
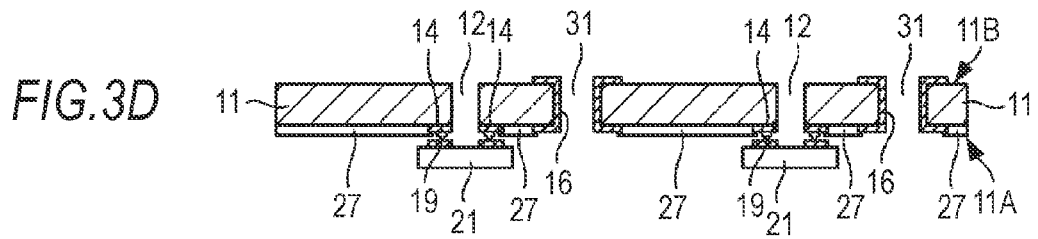

Next, as shown in FIG. 2D and FIG. 3D, the optical device 21 is mounted on the substrate 11. First, the connection bumps 19 are formed on the second electrodes 14 formed in the substrate 11 or electrodes of the optical device 21. Then, the electrodes of the optical device 21 and the second electrodes 14 formed in the substrate 11 are electrically connected through the connection bumps 19 to mount the optical device 21 on the substrate 11.

The optical device 21 is mounted so that the light emitting surface or the light receiving surface faces the first principal surface 11A of the substrate 11 and so that the light emitting point or the light receiving point is positioned at the center of the first through hole 12.

Materials for the connection bumps 19 are conductive materials such as, for example, solder materials, gold and so on. When the connection bumps 19 are made of a solder material, the electrodes of the optical device 21 and the second electrodes 14 of the substrate 11 are connected by melting solder when mounting the optical device 21. When the connection bumps 19 are made of gold, for example, gold bumps are formed on the electrodes of the optical device 21 and surface processing of gold is applied to the second electrodes 14 of the substrate 11 to thereby mount the optical device 21 by gold-gold connection.

Figure 3E:
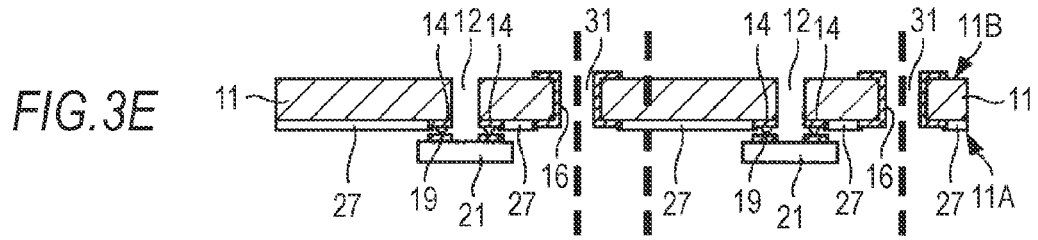

Next, as shown in FIG. 2E and FIG. 3E, the substrate 11 is singulated to have a desired size by dicing and so on after mounting the optical device 21 before the photoelectric composite cable is mounted. In the singulation process, the singulation is performed by cutting the substrate at a position between the second through holes 13 as shown in FIG. 2E by a broken line. Moreover, as shown by broken lines in FIG. 3E, the singulation is performed at positions where the third through holes 31 are formed. The conductive layer formed at inner faces of the third through holes 31 is exposed at side surfaces of the substrate 11 by cutting the third through holes 31. In the conductive layer, the plating layer for protecting the conductive layer from oxidation and so on is already formed on surfaces exposed at inner faces of the third through holes 31. Therefore, this process provides electrodes of the optical module 10 for connecting to the external device, which are formed on the side surface 11C of the substrate 11.

As described above, the conductive layer exposed by cutting the third through holes 31 will be third electrodes 15, the fourth electrodes 16 and the fifth electrodes 17 on the side surface of the substrate 11. The conductive layer is exposed also at a side surface opposite to the side surface 11C of the substrate 11 due to the third through holes 31. When the conductive layer is not necessary, the substrate 11 is cut and removed at a position in the third through hole 31 closer to the optical device 21 than the conductive layer.

Figure 3F:
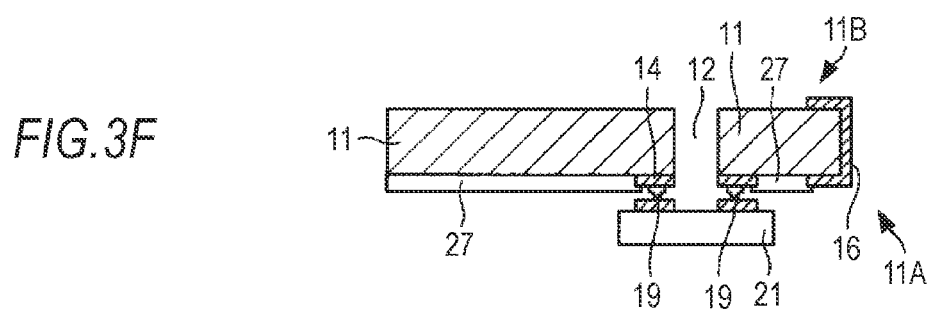

According to the above singulation process, it is possible to manufacture the optical module 10 in which the optical device 21 is mounted on the first principal surface 11A of the substrate 11 as shown in FIG. 2F and FIG. 3F. On the substrate 11, the first through holes 12 for inserting optical fibers of the photoelectric composite cable are formed. Moreover, the second through holes 13 for inserting electric fibers and the first electrodes 18 electrically connected to the electric fibers are formed inside the second through holes 13. Furthermore, the second electrodes 14 for connecting to the optical device 21, the third electrodes 15 as well as the fourth electrodes 16 for connecting from the second electrodes 14 to the external device and the fifth electrodes 17 for connecting from the first electrodes 18 to the external device are formed.

Figure 4G:
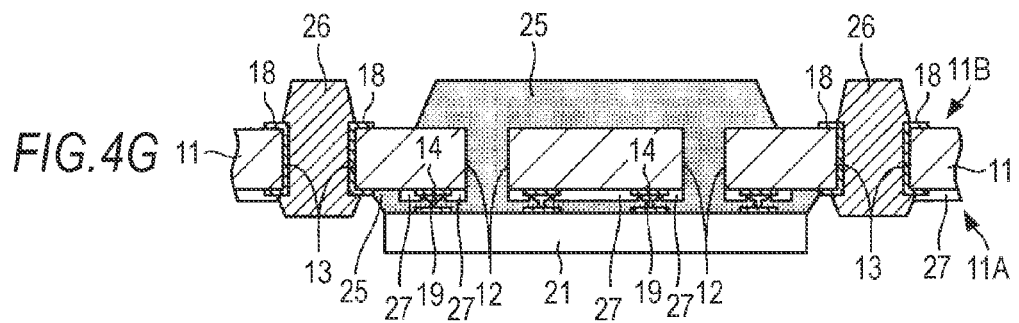
FIGS. 4G to 4I are views for explaining the manufacturing method of the optical module shown in FIGS. 1A and 1B.
Figure 4H:
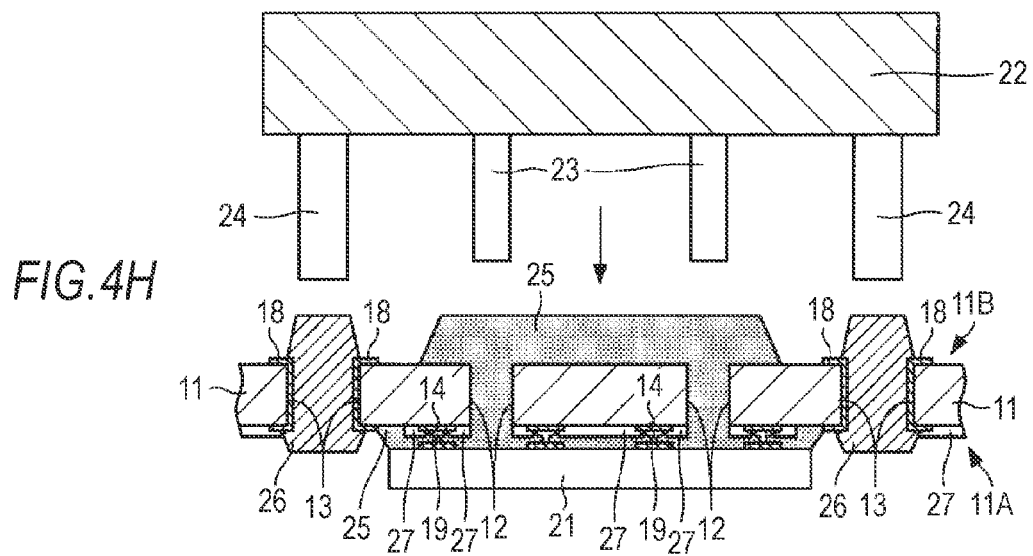
Figure 4I:
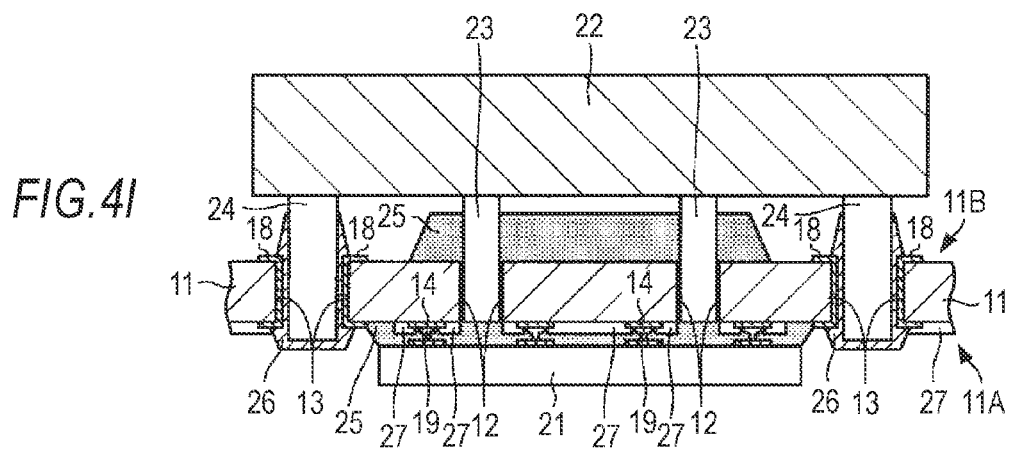
Figure 5G:
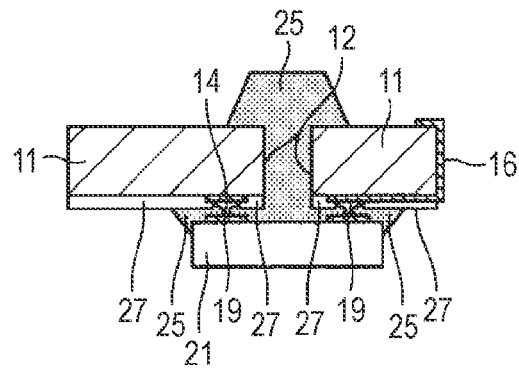
FIGS. 5G to 5I are views for explaining the manufacturing method of the optical module shown in FIGS. 1A and 1B.
Figure 5H:
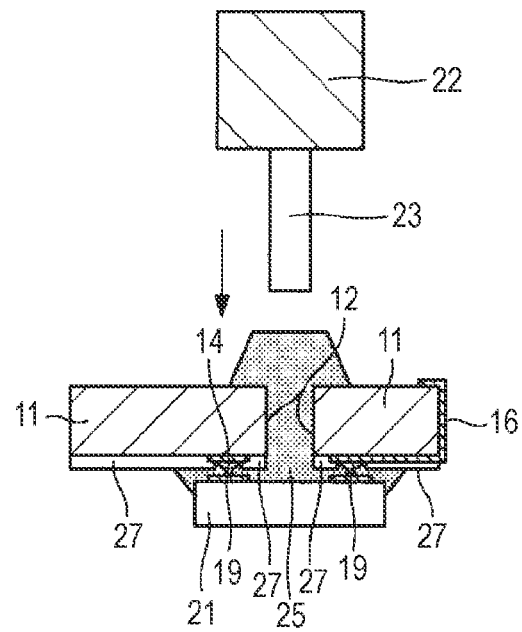
Figure 5I:
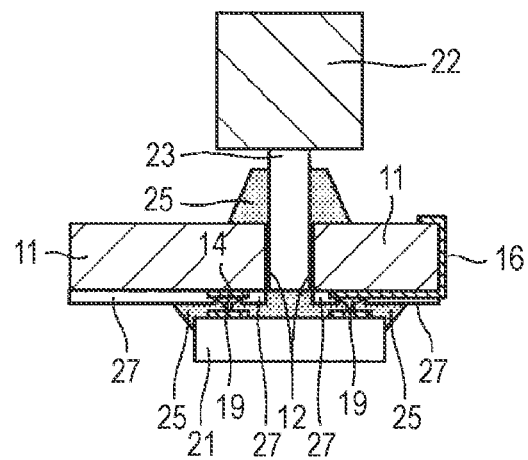

Next, a process of mounting the photoelectric composite cable 22 on the optical module 10 after the singulation process of the optical module 10 will be explained by using FIGS. 4G to 4I and FIG. 5G to FIG. 5I. FIGS. 4G to 4I correspond to cross-sectional views taken along A-A' line of the plan view of the optical module 10 shown in FIG. 1B. FIGS. 5G to 5I correspond to cross-sectional views taken along B-B' line of the plan view of the optical module 10 shown in FIG. 1B.

First, as shown in FIG. 4G and FIG. 5G, the liquid optical resin 25 is applied to the first through holes 12, a gap between the optical device 21 and the substrate 11 as well as the periphery of the first through holes 12 on the second principal surface 11B of the substrate 11. In this case, the optical resin 25 is filled so that voids are not generated in the first through holes 12 and so on. The liquid conductive material 26 is applied to the first electrodes 18 in the second through holes 13.

As materials for the optical resin 25, for example, materials such as thermosetting or a UV curing epoxy resin, acrylic resin and silicon resin can be used. As materials for the conductive material 26, for example, conductive paste materials such as thermosetting silver paste can be used.

Next, as shown in FIG. 4H and FIG. 5H, the optical fibers 23 of the photoelectric composite cable 22 are inserted into the first through holes 12. At the same time, the electric fibers 24 of the photoelectric composite cable 22 are inserted into the second through holes 13.

When the optical fibers 23 are inserted into the first through holes 12, the optical fibers 23 are laid out in positions where ends of the optical fibers 23 do not touch the light emitting point or the light receiving point of the optical device 21 for preventing damage to the optical device 21 as well as positions close to the light emitting point or the light receiving point so that the transmission/reception of signals can be easily performed. As the ends of the optical fibers 23 are close to the light emitting point or the light receiving point of the optical device 21, it is possible to obtain stable optical connection with high optical coupling efficiency between the optical device 21 and the optical fibers 23 as well as with less variation.

Furthermore, as shown in FIG. 4I and FIG. 5I, the optical resin 25 and the conductive material 26 are cured by heating processing after inserting the photoelectric composite cable 22, thereby fixing the optical fibers 23 and the electric fibers 24. In the case where the optical resin 25 is a UV curing material, the optical resin 25 is cured by further applying a UV irradiation process.

The optical module 10 to which the photoelectric composite cable 22 is connected having the structure shown in FIGS. 1A and 1B can be manufactured by the above processes.

According to the above processes shown in FIGS. 4G to 4I and FIG. 5G to FIG. 5I, optical alignment between the optical fibers 23 and the optical device 21 which has been complicated in layout in related art can be easily achieved by using the substrate 11 included in the optical module 10. The electrical connection of the electric fibers 24 can be also achieved easily at the same time as the connection of the optical fibers 23. Moreover, the connection of the optical fibers 23 and the electric fibers 24 is performed by the through holes of the same substrate 11, and electrical connection between the optical device 21 or the electric fibers 24 and the external device can be realized through the conductive layer on the substrate 11. Accordingly, it is not necessary to form conductors for electrical connection outside the optical module 10, which can realize miniaturization of the optical module 10 and the device including the optical module 10.

In the above manufacturing method, the singulation process shown in FIG. 2E and FIG. 3E may be performed after the process of mounting the photoelectric composite cable 22 which is shown in FIG. 4H and FIG. 5H. However, in the case where the photoelectric composite cable 22 is long, it is preferable to perform the singulation process before the process of mounting the photoelectric composite cable 22 as arrangement of the process will be complicated after the mounting of the photoelectric composite cable 22.

<3. Second Embodiment of Optical Module>

Next, a second embodiment of the optical module will be explained.

Figure 7A:
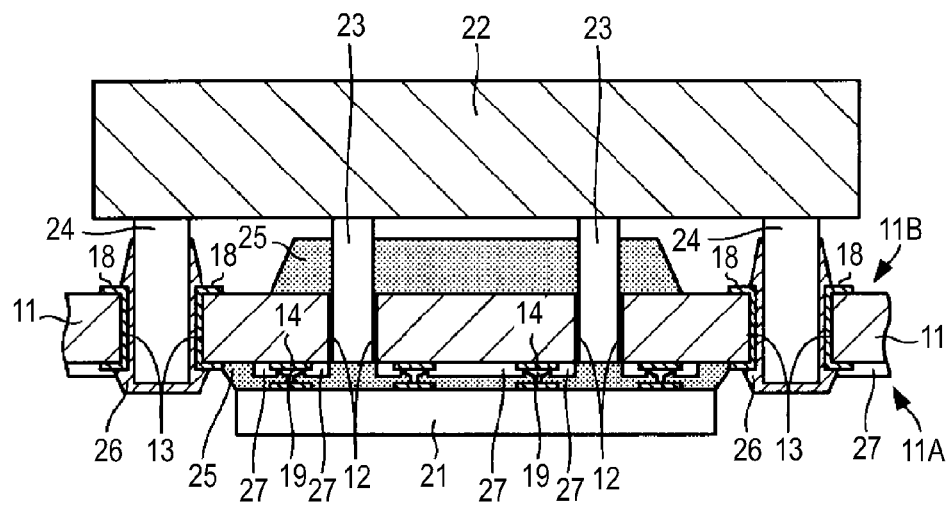
FIG. 7A is a cross-sectional view showing a structure of an optical module according to a second embodiment and FIG. 7B is a plan view showing the structure of the optical module according to the second embodiment.
Figure 7B:
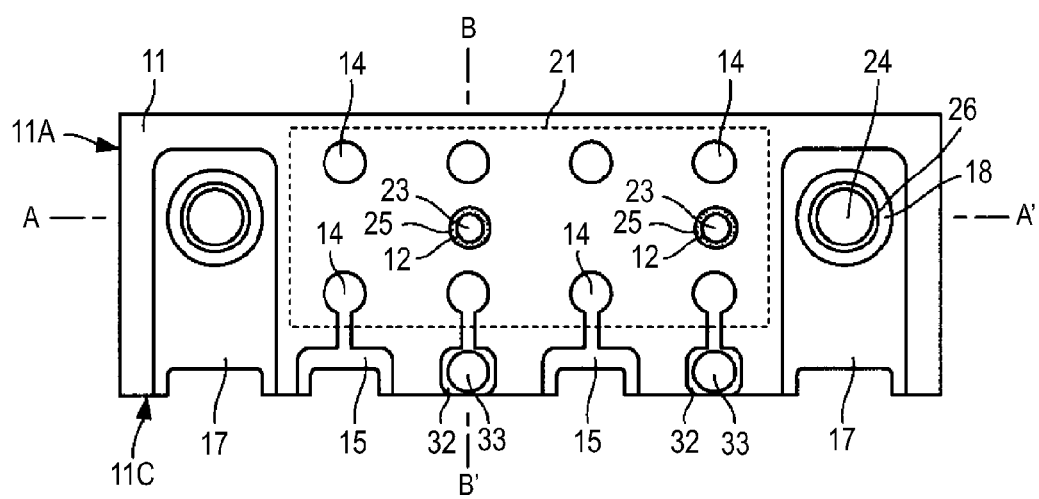

FIGS. 7A and 7B show schematic structural views of an optical module according to the second embodiment. FIG. 7A is a cross-sectional view of an optical module 20 and FIG. 7B is a plan view of a surface on which the optical device 21 of the optical module 20 is mounted. In FIG. 7B, only a position on which the optical device 21 is mounted is shown by broken lines. In the following explanation of the embodiment, the same signs are assigned to the same components as the first embodiment and detailed explanation is omitted.

The optical module 20 shown in FIGS. 7A and 7B includes the substrate 11 and the optical device 21 mounted on the substrate 11. The optical device 21 is mounted on the first principal surface 11A side of the substrate 11. The photoelectric composite cable 22 is connected from the direction of the second principal surface 11B side of the substrate 11. The photoelectric composite cable 22 includes optical fibers 23 for optical signals and electric fibers 24 for electric signals.

The second electrodes 14 are formed on the first principal surface 11A side of the substrate 11. The second electrodes 14 and electrodes of the optical device 21 are electrically connected through the connection bumps 19. Moreover, the optical resin 25 is formed in the gap between the first principal surface 11A of the substrate 11 and the optical device 21 as well as in gaps in the first through holes 12 with respect to the optical fiber 23.

The first electrodes 18 are formed in the second through holes 13 of the optical module 20 and the electric fibers 24 inserted into the second through holes 13 and the first electrodes 18 are electrically connected by the conductive material 26.

The optical module 20 according to the second embodiment includes third electrodes 15 provided on a side surface 11C of the substrate 11 so as to continue from the second electrodes 14 on the first principal surface for performing electrical connection between the optical device 21 and the external device. Moreover, fifth electrodes 17 provided on the side surface 11C of the substrate 11 so as to continue from the first electrodes 18 provided inside the second through holes 13 for performing electrical connection between the electric fibers 24 of the photoelectric composite cable 22 and the external device. The third electrodes 15 and the fifth electrodes 17 are made of the conductive layer provided on the whole inner face of the concave portion formed on the side surface 11C of the substrate 11.

The optical module 20 further includes fourth electrodes 32 provided so as to continue from the second electrodes 14 on the first principal surface for performing electrical connection between the optical device 21 and the external device.

The fourth electrodes 32 are made of the conductive layer formed on the first principal surface 11A of the substrate 11. Here, the conductive layer making the fourth electrodes 32 is not formed on the side surface 11C of the substrate 11. Then, conductive bumps 33 for connection to the external device are provided on the fourth electrodes 32.

Figure 8A:
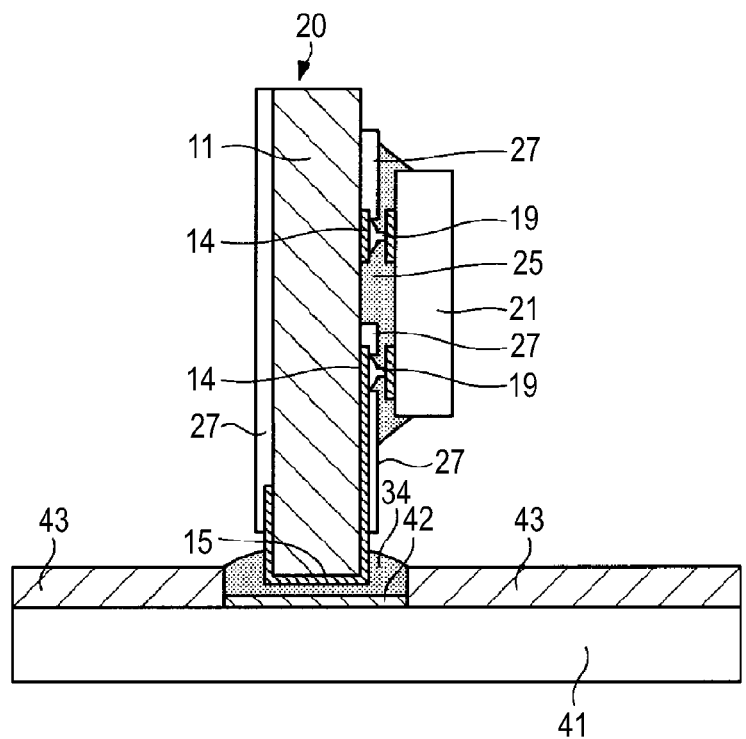
FIGS. 8A and 8B are views for explaining a method of connecting the optical module.

In the structure of forming electrodes on the side surface 11C of the substrate 11, for example, in the third electrodes 15 and the fifth electrodes 17, the optical module 20 is mounted on the external device by soldering and so on in a manner shown in FIG. 8A. In FIG. 8A, electrodes 42 for connecting an insulating layer 43 and the optical module 20 are provided on a circuit substrate 41 of the external device. The third electrodes 15 of the optical module 20 are connected on the electrodes 42 by a conductive material 34 made of solder or a conductive paste and the like.

For example, when the external device to be connected to the optical module 20 is a transmission device and a high-speed signal higher than GHz is propagated from the transmission device, a joint portion formed by the conductive material 34 will be a stub structure in the light of high-frequency transmission in the structure shown in FIG. 8A. Accordingly, there is a possibility that excessive parasitic capacitance is generated due to the stub structure to cause a loss in the high-frequency transmission.

Figure 8B:
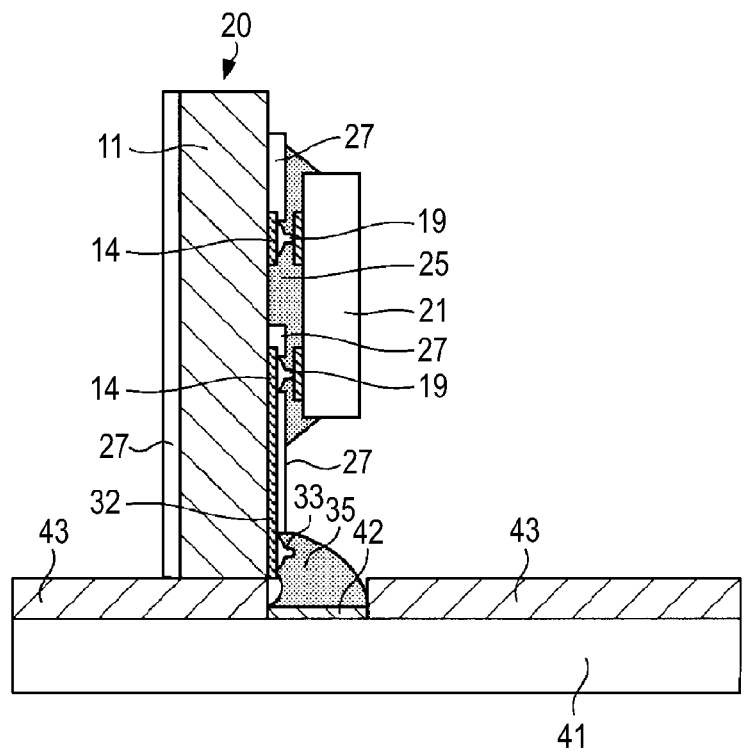

In response to this, in the structure of forming electrodes including the conductive bumps 33 on the first principal surface 11A of the substrate 11, for example, in the fourth electrodes 32, the optical module 20 is mounted on the external device by soldering and so on in a manner shown in FIG. 8B.

In FIG. 8B, the electrode 42 for connecting the insulating layer 43 and the optical module 20 is provided on the circuit substrate 41 of the external device. The electrodes 42 of the circuit substrate 41 are provided so as to be close to the first principal surface 11A of the optical module 20 to be mounted. The conductive bumps 33 formed on the fourth electrodes 32 of the optical module 20 and the electrodes 42 are connected by a conductive material 35 made of solder, the conductive paste and so on.

The structure shown in FIG. 8B is not the stub structure as the electrodes formed on the side surface 11C of the substrate 11 are not used even when the high-speed signal is transmitted. Accordingly, signal transmission can be performed with low parasitic capacitance. Therefore, in the structure in which the conductive bump 33 is formed on the fourth electrode 32, good transmission characteristics can be obtained with respect to high-speed signals higher than GHz.

In the connection between the optical module 20 and the external device, it is not necessary to apply the structure shown in FIG. 8 to the power supply or the ground as well as cases where low-speed signals such as control signals are transmitted, and the structure shown in FIG. 8A in which relatively higher mechanical strength can be obtained may be applied.

It is preferable that the structure shown in FIG. 8A and the structure shown in FIG. 8B are mixed as the connection structure between the optical device 20 and the circuit substrate 41 at the time of mounting as needed.

<4. Manufacturing Method of Optical Module in Second Embodiment>

Next, a manufacturing method of the optical module according to the second embodiment will be explained with reference to FIGS. 9A to 9F and FIGS. 10A to 10F. FIGS. 9A to 9F correspond to cross-sectional views taken along A-A' line of the plan view of the optical module 20 shown in FIG. 7B. FIGS. 10A to 10F correspond to cross-sectional views taken along B-B' line of the plan view of the optical module 20 shown in FIG. 7B.

Figure 10A:
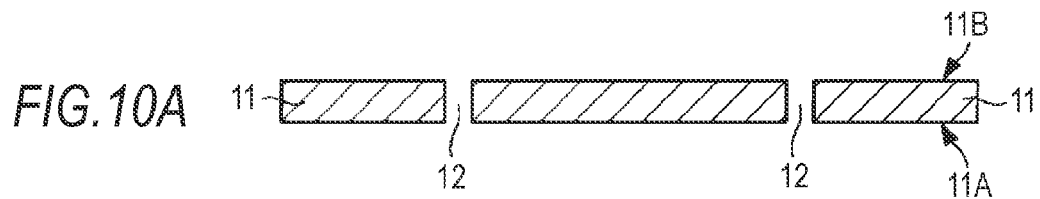
FIGS. 10A to 10F are views for explaining the manufacturing method of the optical module shown in FIGS. 7A and 7B.

First, as shown in FIG. 9A and FIG. 10A, the first through holes 12 and the second through holes 13 are formed in the substrate 11. At the same time, not-shown third through holes are formed in the substrate 11.

Figure 10B:
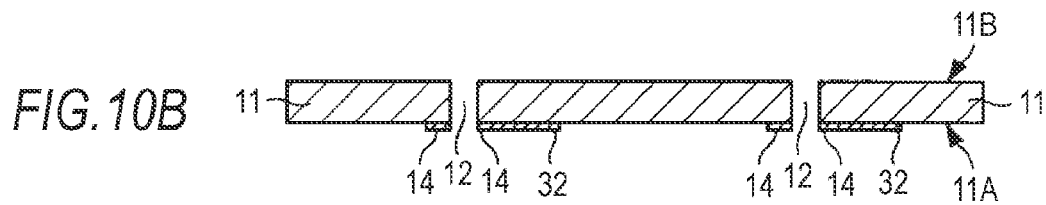

Next, as shown in FIG. 9B, the conductive layer is formed at given positions on the first principal surface 11A of the substrate 11 and inner faces of the second through holes 13. The conductive layer is also formed at inner faces of the not-shown third through holes. As the same time, the conductive layer is formed at given positions on the first principal surface 11A of the substrate 11 as shown in FIG. 10B.

According to the above process, the second electrodes 14 and the fourth electrodes 32 provided so as to continue from the second electrodes 14 are formed on the first principal surface 11A of the substrate 11. At the same time, the first electrodes 18 are formed at inner surfaces of the second through holes 13 and the third electrodes 15 and the fifth electrodes 17 are formed at inner faces of the not-shown third through hole. As shown in FIG. 10B, in one of the second electrodes 14 which face to each other through the first through hole 12, one end of second electrode 14 close to the first through hole 12 will be the second electrode 14 and the other end will be the fourth electrode 32.

Figure 10C:
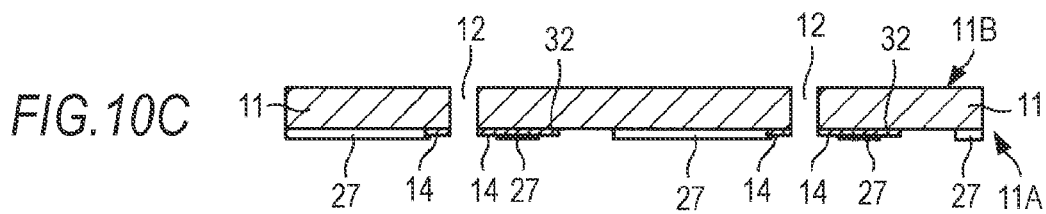

Next, as shown in FIG. 9C and FIG. 10C, the insulating layer 27 is formed so as to cover desired positions on the substrate 11. The insulating layer 27 is formed on the conductive layer so that portions corresponding to the second electrodes 14 and portions corresponding to the fourth electrodes 32 are opened as shown in FIG. 10C.

Figure 10D:
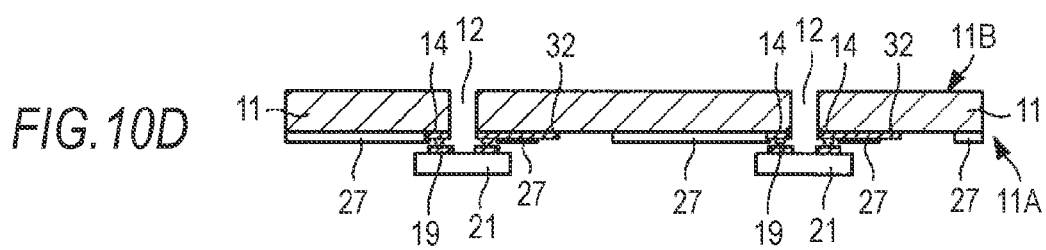

As shown in FIG. 9D and FIG. 10D, the optical device 21 is mounted on the first principal surface 11A of the substrate 11 by connecting the electrodes of the optical device 21 to the second electrodes 14 through the connection bumps 19.

Figure 10E:
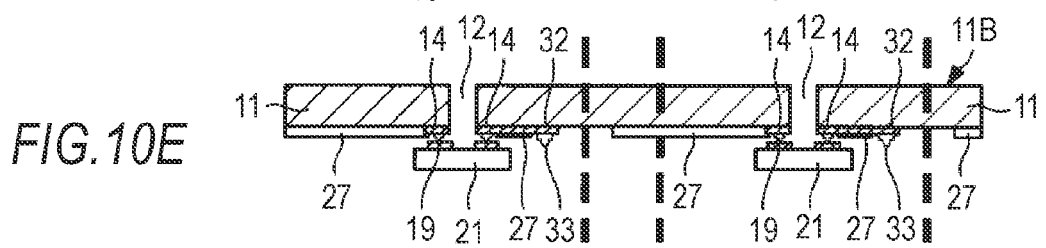

Next, as shown in FIG. 9E and FIG. 10E, the conductive bumps 33 are formed on the fourth electrodes 32. Materials for the conductive bumps 33 are conductive materials such as solder materials or gold.

Moreover, the optical module 20 is singulated by cutting the substrate at the position between the second electrodes 13 as well as positions where the not-shown third through holes are formed as shown by broken lines in FIG. 9E and FIG. 10E. When the third through holes are cut, the conductive layer at inner faces of the third through holes is exposed and the third electrodes 15 and the fifth electrodes 17 are formed on the side surface 11C of the substrate 11.

Figure 10F:
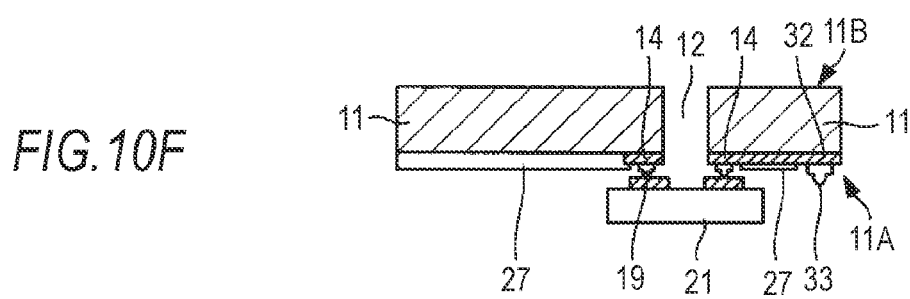

According to the above singulation process, it is possible to manufacture the optical module 20 in which the optical device 21 is mounted on the first principal surface of the substrate 11 as shown in FIG. 9F and FIG. 10F. In the optical module 20, the third electrodes 15 for connecting from the second electrodes 14 to the external device are formed on the side surface 11C of the substrate 11. The fourth electrodes 32 are formed on the first principal surface 11A of the substrate 11 and the conductive bumps 33 for connecting from the second electrodes 14 to the external device are formed on the fourth electrodes 32.

Next, the photoelectric composite cable 22 is connected to the optical module 20 formed by the above processes in the same manner as the first embodiment shown in FIGS. 4G to 4I and FIG. 5G to FIG. 5I, thereby manufacturing the optical module 20 to which the photoelectric composite cable 22 having the structure shown in FIGS. 7A and 7B is connected.

<5. Third Embodiment of Optical Module>

Next, a third embodiment of the optical module will be explained.

Figure 11A:
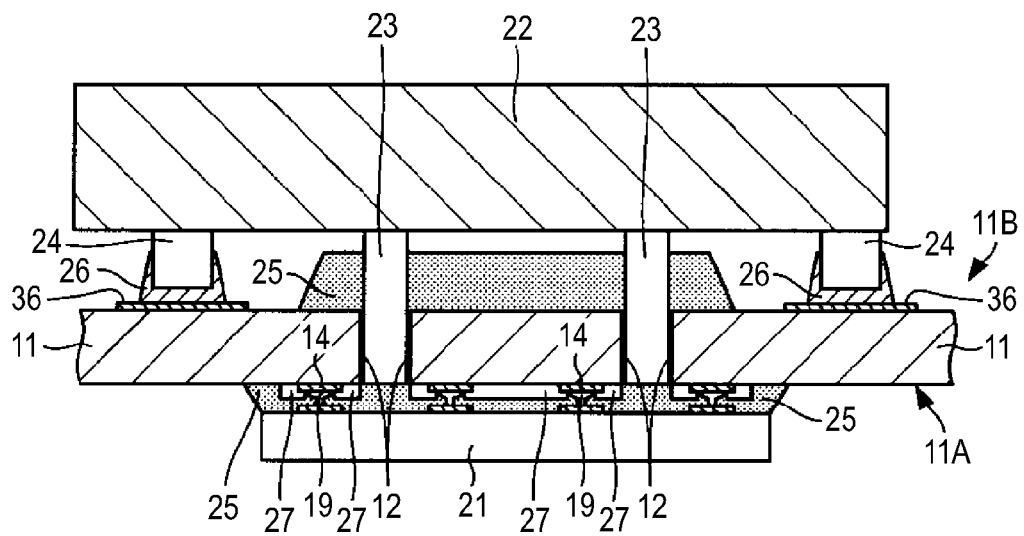
FIG. 11A is a cross-sectional view showing a structure of an optical module according to a third embodiment and FIG. 11B is a plan view showing the structure of the optical module according to the third embodiment.
Figure 11B:
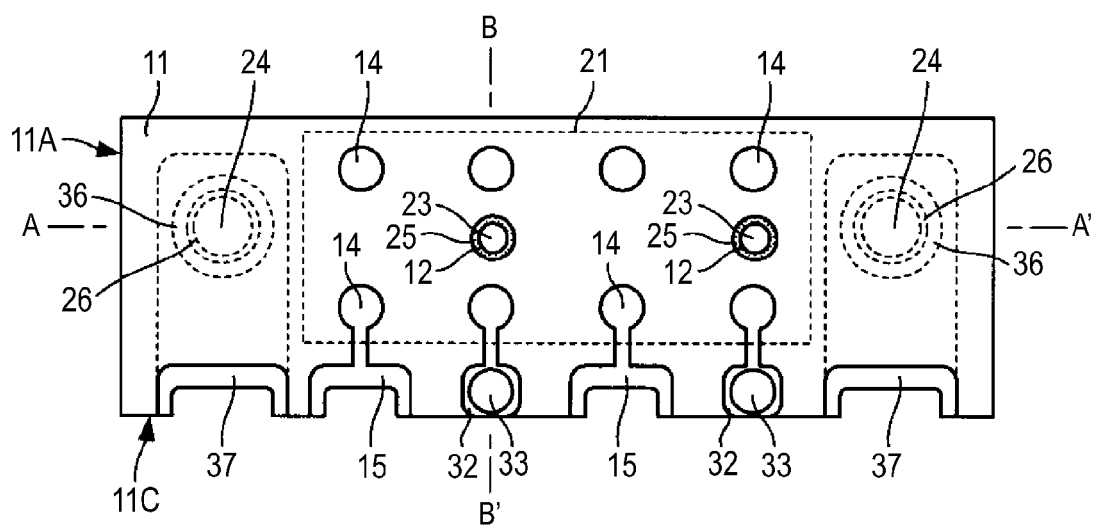

FIGS. 11A and 11B show schematic structural views of an optical module according to the second embodiment. FIG. 11A is a cross-sectional view of an optical module 30 and FIG. 11B is a plan view of a surface on which the optical device 21 of the optical module 30 is mounted. In FIG. 11B, only a position on which the optical device 21 is mounted is shown by broken lines. In the following explanation of the embodiment, the same signs are assigned to the same components as the first embodiment and the second embodiment, and detailed explanation is omitted.

The optical module 30 shown in FIGS. 11A and 11B includes the substrate 11 and the optical device 21 mounted on the substrate 11. The optical device 21 is mounted on the first principal surface 11A side of the substrate 11. The second electrodes 14 are formed on the first principal surface 11A side of the substrate 11. The second electrodes 14 and the electrodes of the optical device 21 are electrically connected through the connection bumps 19.

The photoelectric composite cable 22 is connected to the optical module 30 from the second principal surface 11B side of the substrate 11. The photoelectric composite cable 22 includes optical fibers 23 for optical signals and electric fibers 24 for electric signals. The optical fibers 23 are inserted into the first through holes 12 formed in the substrate 11. The optical resin 25 is formed in the gap between the first principal surface 11A and the optical device 21 as well as in gaps in the first through holes 12 with respect to the optical fibers 23.

Furthermore, the optical module 30 according to the third embodiment includes first electrodes 36 for connecting the electric fibers 24 of the photoelectric composite cable 22 on the second principal surface 11B of the substrate 11. The electric fibers 24 extended from the photoelectric composite cable 22 are connected to the first electrodes 36 by the conductive material 26.

The optical modules according to the first and second embodiments have the structure in which the first electrodes connecting to the electric fibers 24 are formed inside the second through holes, whereas, in the optical module 30 according to the third embodiment, the first electrodes 36 connecting to the electric fibers 24 are formed on the second principal surface 11B of the substrate 11.

The optical module 30 also includes the third electrodes 15 provided on the side surface 11C of the substrate 11 so as to continue from the second electrodes 14 on the first principal surface for performing electrical connection between the optical device 21 and the external device as shown in FIG. 11B. The optical module 30 also includes the fourth electrodes 32 provided so as to continue from the second electrodes 14 on the first principal surface for performing electrical connection between the optical device 21 and the external device as well as the conductive bumps 33 provided on the fourth electrodes 32 for connecting to the external device.

Moreover, fifth electrodes 37 provided on the side surface 11C of the substrate 11 so as to continue from the first electrodes 36 formed on the second principal surface 11B for performing electrical connection between the electric fibers 24 of the photoelectric composite cable 22 and the external device. The connection from the first electrodes 36 to the fifth electrodes 37 is made by the conductive layer formed on the second principal surface 11B of the substrate 11. In FIG. 11B, the structure formed on the first principal surface 11A of the substrate 11 is shown by solid lines and the structure formed on the second principal surface 11B is shown by broken lines.

The fifth electrodes 37 is made of the conductive layer provided on the whole inner face of the concave portion formed in the side surface 11C of the substrate 11 in the same manner as the third electrodes 15.

As described above, the positioning between the optical fibers 23 and the optical device 21 can be easily performed by forming the first through holes 12 in the substrate 11 and inserting the optical fibers 23 into the first through holes 12, thereby increasing reliability of optical connection and optical coupling efficiency.

Additionally, it is not necessary that the electric fibers 24 are inserted into the through holes as long as the electric fibers 24 can be connected to the first electrodes 36 of the substrate 11 and the conductive layer connecting to the fifth electrodes 37 for connecting from the first electrodes 36 to the external device is formed. Therefore, the processes of forming the second through holes, filling the conductive paste into the through holes, insertion of the electric fibers and so on can be cut by applying the structure of the optical module 30 according to the third embodiment, as a result, the manufacturing processes can be simplified.

<6. Manufacturing Method of Optical Module in Third Embodiment>

Next, a manufacturing method of the optical module according to the third embodiment will be explained with reference to FIGS. 12A to 12F and FIGS. 13A to 13F. FIGS. 12A to 12F correspond to cross-sectional views taken along A-A' line of the plan view of the optical module 30 shown in FIG. 11B. FIGS. 13A to 13F correspond to cross-sectional views taken along B-B' line of the plan view of the optical module 30 shown in FIG. 11B.

Figure 13A:
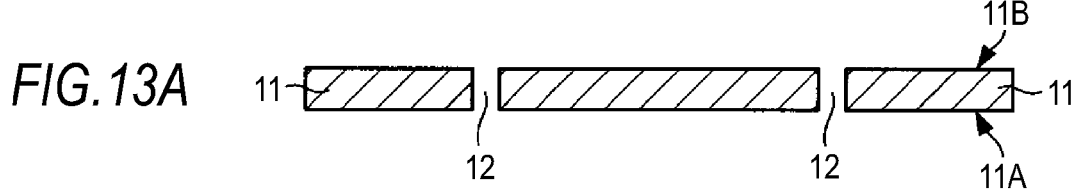
FIGS. 13A to 13F are views for explaining the manufacturing method of the optical module shown in FIGS. 11A and 11B.

First, as shown in FIG. 12A and FIG. 13A, the first through holes 12 are formed in the substrate 11. At the same time, not-shown third through holes are formed in the substrate 11.

Next, as shown in FIG. 12B, the conductive layer is formed at given positions on the first principal surface 11A of the substrate 11 as shown in FIG. 12B. The conductive layer is also formed at inner faces of the not-shown third through holes. Moreover, the conductive layer are formed at given positions on the second principal surface 11B of the substrate 11 as shown in FIG. 12B.

Figure 13B:
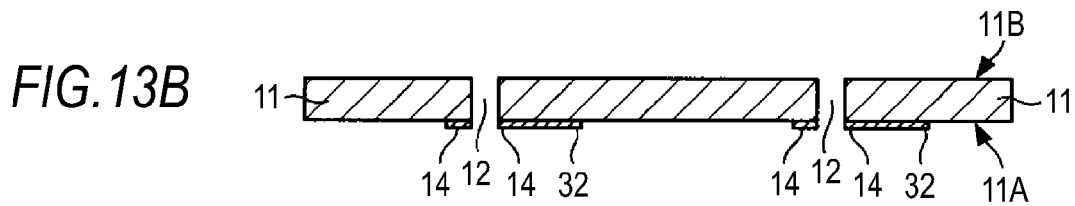

At the same time, the conductive layer is formed at given positions on the first principal surface 11A of the substrate 11 as shown in FIG. 13B.

According to the above processes, the second electrodes 14 and the fourth electrodes 32 provided so as to continue from the second electrodes 14 are formed on the first principal surface 11A of the substrate 11. At the same time, the third electrodes 15 are formed at inner faces of the not-shown third through holes as well as the first electrodes 36 are formed on the second principal surface 11B of the substrate 11. Moreover, the fourth electrodes 32 provided so as to continue from the second electrodes 14 are formed on the first principal surface 11A of the substrate 11.

Figure 13C:
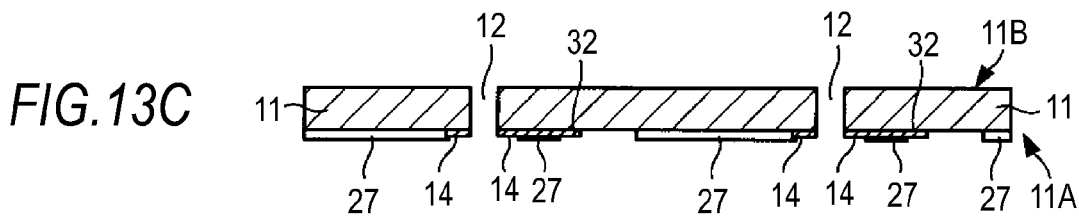

Next, as shown in FIG. 12C and FIG. 13C, the insulating layer 27 is formed so as to cover desired positions on the substrate 11. The insulating layer 27 is formed on the conductive layer so that portions corresponding to the second electrodes 14 as well as portions corresponding to the fourth electrodes 32 open as shown in FIG. 13C.

Figure 13D:
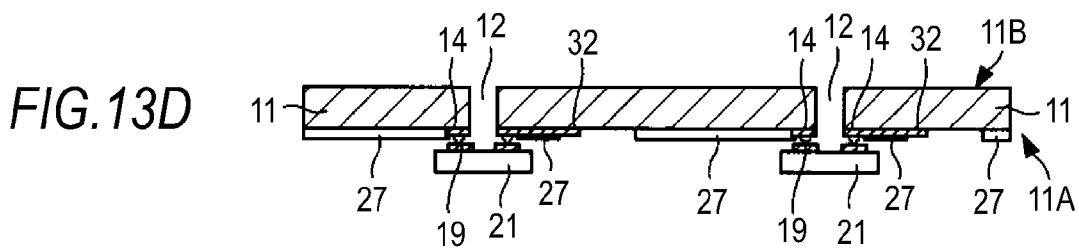

As shown in FIG. 12D and FIG. 13D, the optical device 21 is mounted on the substrate 11 by connecting the electrodes of the optical device 21 on the second electrodes 14 formed in the substrate 11 through the connection bumps 19.

Figure 13E:
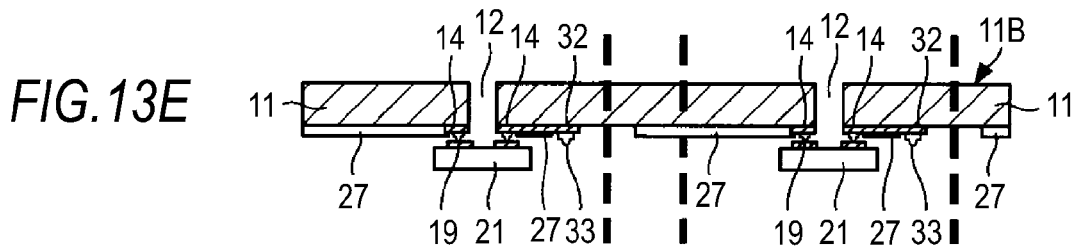

Next, as shown in FIG. 12E and FIG. 13E, the conductive bumps 33 are formed on the fourth electrodes 32. Moreover, the optical module 30 is singulated by cutting the substrate at a position between the first through holes 12 as well as positions where the not-shown third through holes are formed as shown by broken lines in FIG. 12E and FIG. 13E. When the third through holes are cut, the conductive layer at inner faces of the third through holes is exposed, and the third electrodes 15 and the fifth electrodes 37 are formed on the side surface 11C of the substrate 11.

Figure 13F:
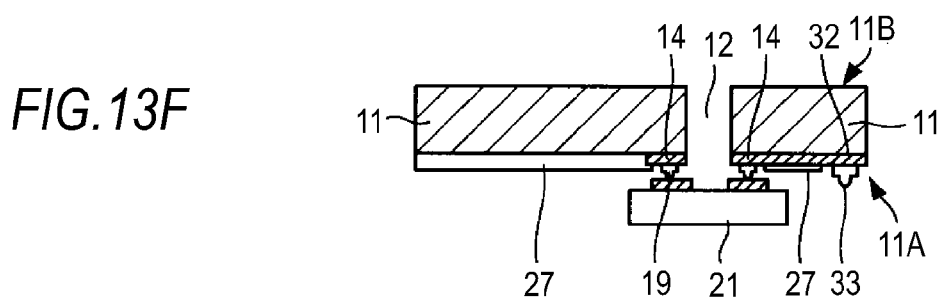

According to the above singulation process, it is possible to manufacture the optical module 30 in which the optical device 21 is mounted on the first principal surface of the substrate 11 as shown in FIG. 12F and FIG. 13F. In the optical module 30, the first electrodes 36 for connecting to the electric fibers 24 of the photoelectric composite cable 22 are formed on the second principal surface 11B of the substrate 11.

Moreover, the third electrodes 15 for connecting from the second electrodes 14 to the external device are formed on the side surface 11C of the substrate 11. The fourth electrodes 32 are formed on the first principal surface 11A of the substrate 11, and the conductive bumps 33 for connecting from the second electrodes 14 to the external device are formed on the fourth electrodes 32.

Figure 14G:
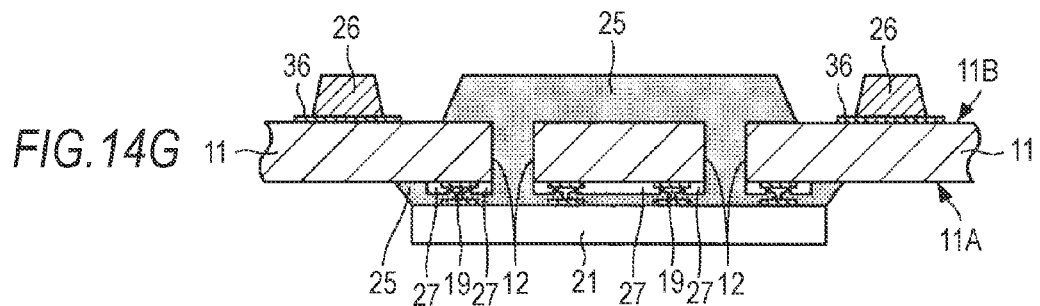
FIGS. 14G to 14I are views for explaining the manufacturing method of the optical module shown in FIGS. 11A and 11B.
Figure 14H:
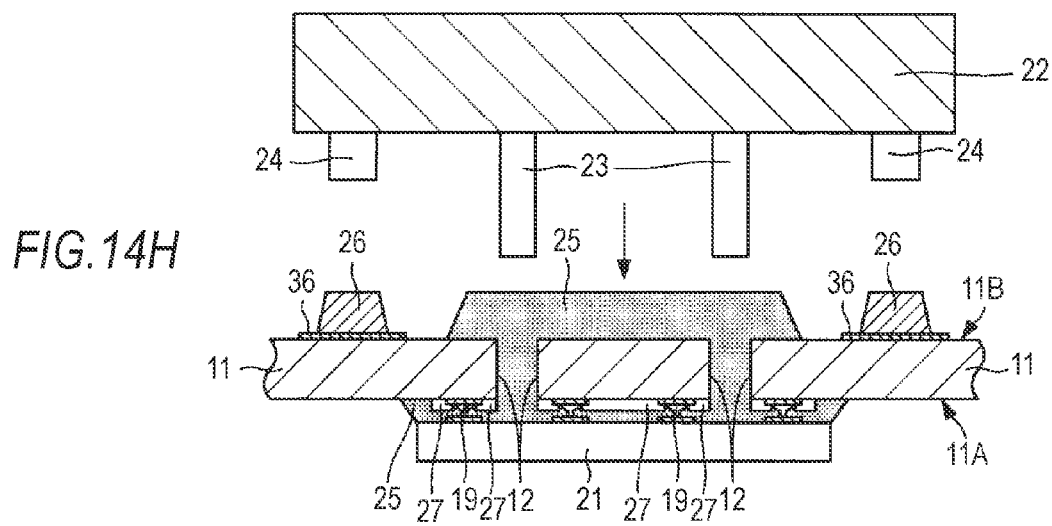
Figure 14I:
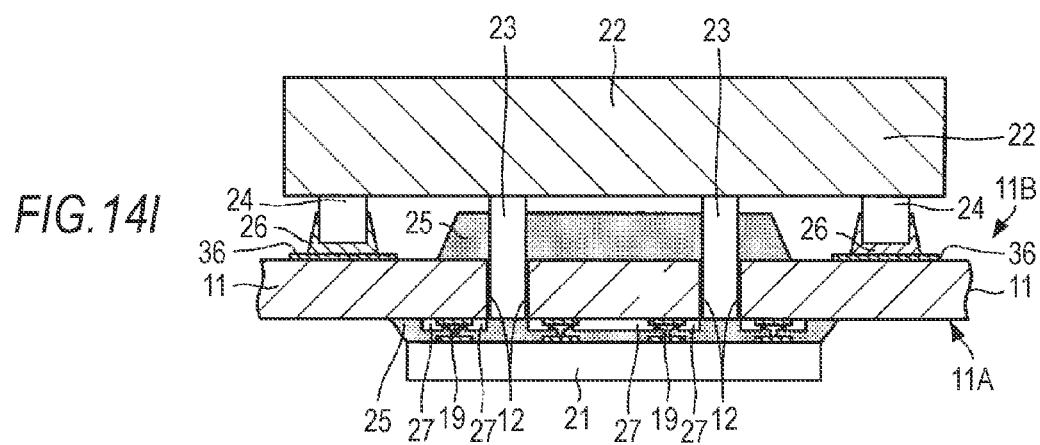

Next, a process of mounting the photoelectric composite cable 22 on the optical module 30 performed after the singulation process of the optical module 30 will be explained with reference to FIGS. 14G to 14I and FIG. 15G to 15I. FIGS. 14G to 14I correspond to cross-sectional views taken along A-A' line of the plan view of the optical module 30 shown in FIG. 11B. FIGS. 15A to 15F correspond to cross-sectional views taken along B-B' line of the plan view of the optical module 30 shown in FIG. 11B.

Figure 15G:
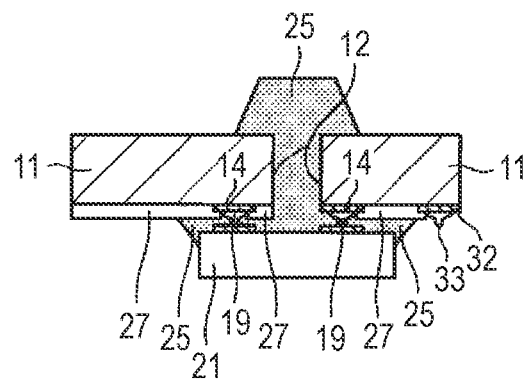
FIGS. 15G to 15I are views for explaining the manufacturing method of the optical module shown in FIGS. 11A and 11B.

As shown in FIG. 14G and FIG. 15G, the liquid optical resin 25 is applied to the first through holes 12, the gap between the optical device 21 and the substrate 11 as well as the periphery of the first through holes 12 on the second principal surface 11B of the substrate 11 before inserting the photoelectric composite cable 22. In this case, the optical resin 25 is filled so that voids are not generated in the first through holes 12 and so on.

The liquid conductive material 26 for obtaining electrical connection with respect to the electric fibers is applied on the first electrodes 36.

Figure 15H:
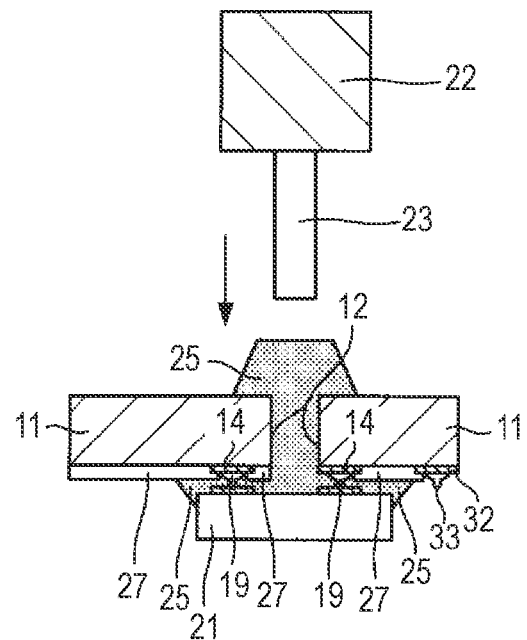

Next, as shown in FIG. 14H and FIG. 15H, the optical fibers 23 of the photoelectric composite cable 22 are inserted into the first through holes 12. At the same time, the electric fibers 24 of the photoelectric composite cable 22 are allowed to touch the conductive material 26 on the first electrodes 36.

Figure 15I:
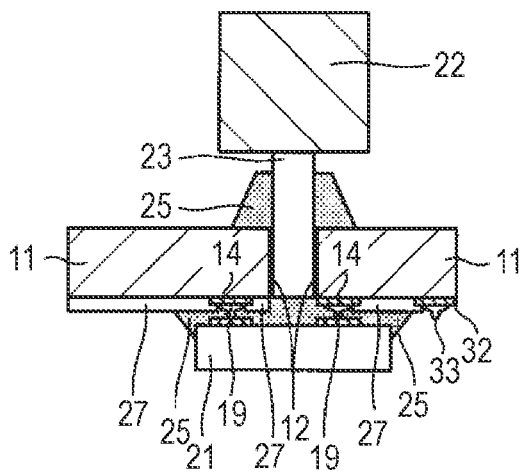

Moreover, as shown in FIG. 14I and FIG. 15I, the optical resin 25 and the conductive material 26 are cured by a heating process after inserting the optical fibers 23, thereby fixing the optical fibers 23 and the electric fibers 24. When the optical resin 25 is a UV curing material, the optical resin 25 is further cured by the UV irradiation process.

It is possible to manufacture the optical module 30 to which the photoelectric composite cable 22 is connected having the structure shown in FIGS. 11A and 11B by the above processes.

<7. Embodiment of Optical Communication Device>

Next, an embodiment of an optical communication device will be explained.

Figure 16:
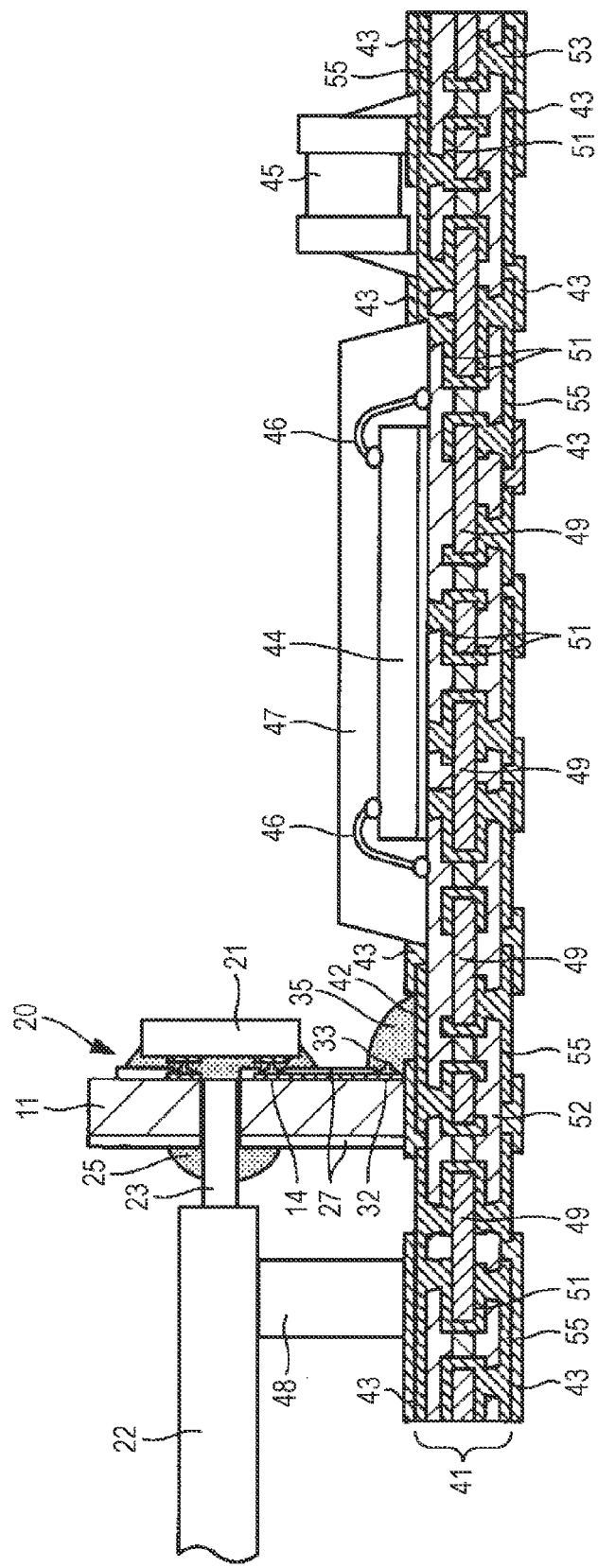
FIG. 16 is a view showing a structure of an optical communication device according to an embodiment.

FIG. 16 shows a schematic structural view of an optical communication device according to the embodiment. In FIG. 16, an example in which the optical module 20 according to the second embodiment is mounted on the optical communication device is shown.

In an optical communication device 40 shown in FIG. 16, the optical module 20 and a driving device 44 for the optical device 21 are mounted on the circuit substrate 41.

In the optical module 20, the optical device 21 is mounted on the substrate 11 and the photoelectric composite cable 22 is connected. In FIG. 16, only the structures of the optical connection portion between the optical fiber 23 and the optical device 21 of the optical module 20 as well as the structures of the second electrode 14, the fourth electrode 32 and the conductive bump 33 are shown, and the structures of the electric fibers, the first electrode, the fifth electrode and the like are omitted.

The circuit substrate 41 includes an insulating substrate 49 made of, for example, an organic multilayer substrate, a multilayer ceramic substrate and so on, conductive layers 51, 55 and insulating layers 43, 52 formed on the insulating substrate 49. Plural through holes are formed in the insulating substrate 49, and the conductive layer 51 formed at both surfaces of the insulating substrate 49 is connected through the conductive layer 51 formed in the through holes. The insulating layer 52 is formed over the conductive layer 51 at both surfaces of the insulating substrate 49. Moreover, the insulating layer 55 exposed on the surface of the circuit substrate 41 is formed on the insulating layer 52. The conductive layer 51 and the conductive layer 55 are connected by vias piercing through the insulating layer 52. The insulating layer 43 covers the conductive layer 55 except portions to be electrodes and the like of the conductive layer 55.

In the conductive layer 55 on the surface of the circuit substrate 41, the electrodes 42 for mounting the optical module 20 and an input/output terminal 53 for connecting to a power source and the like of the optical communication device 40 are formed. A passive device 45 such as a decoupling capacitor of the power source, which associates with the driving device 44 is mounted between the input/output terminal 53 of the circuit substrate 41 and the driving device 44.

The driving device 44 is mounted on the circuit substrate 41 by wire bonds 46. The driving device 44 is sealed by a sealant 47 covering the driving device 44 and the wire bonds 46. As a method of mounting the driving device 44, respective methods such as flip-chip mounting, WLP (Wafer-level-Package) and CSP (Chip-Size-Package) can be used in addition to the wire bonds 46.

As a method of mounting the optical module 20 on the substrate, for example, the conductive bumps 33 formed on the fourth electrodes 32 of the optical module 20 are connected to the electrodes 42 of the circuit substrate 41 through the solder. The structure is the same as the structure of FIG. 8B.

The method of mounting the optical module 20 on the substrate can be the same structure as, for example, the structure of FIG. 8A in which the electrodes formed on the side surface of the substrate 11 of the optical module 20 are connected to the electrodes 42 of the circuit substrate 41 through the solder. In this method, the optical module 20 can be mounted with the passive device 45 by using, for example, a common solder mounting (SMT: Surface-Mount-Technology) process.

When referring to the manufacturing method of the optical module according to the second embodiment, the optical module is mounted on the circuit substrate 41 with the photoelectric composite cable 22 after the photoelectric composite cable 22 is connected to the optical module. After the process, for example, when it is difficult to handle the photoelectric composite cable 22 at the time of mounting the optical module 20 to the optical communication device 40, it is also preferable that the photoelectric composite cable 22 is connected to the optical module 20 after the optical module 20 is mounted on the circuit substrate 41. The same applies to the optical modules according to the first embodiment and the third embodiment.

Also in the optical communication device 40, a cable holding member 48 is provided for holding the photoelectric composite cable 22 and the circuit substrate 41. When the photoelectric composite cable 22 is fixed by the optical module 20 alone, the detachment of the photoelectric composite cable 22 from the optical module 20, breaking and so on of the cable are liable to occur in the case where the fixing portion is weak on handling. It is possible to prevent the above by providing the cable holding member 48. In this case, the cable holding member 48 is formed by, for example, an adhesive made of an insulating or conductive material.

When the optical communication device 40 is a transmission device, an electric signal inputted from the input/output terminal 53 to the circuit substrate 41 is inputted to the driving device 44. Then, the signal is converted into a signal necessary for driving the optical device 21 in the driving device 44, and the converted signal is outputted from the driving device 44. The signal outputted from the driving device 44 is inputted to the optical device 21 through the electrodes 42, the conductive layers 51, 55 of the circuit substrate 41 as well as the electrodes and so on of the optical module 20. Then, electrical-optical conversion is performed by the optical device 21 as the light emitting device and an optical signal is outputted through the optical fibers 23 of the photoelectric composite cable 22.

When the optical communication device 40 is a receiving device, an optical signal inputted through the optical fibers 23 is incident on the optical device 21 as the light receiving device and optical/electrical conversion is performed in the optical device 21. Then, an electric signal is inputted from the optical device 21 to the driving device 44 through the electrodes of the optical module 20 as well as the electrodes 42, the conductive layers 51, 55 and so on of the circuit substrate 41. Then, the electric signal converted into a necessary signal in the driving device 44 is outputted. The signal outputted from the driving device 44 is outputted from the input/output terminal 53 to the outside of the device through the electrodes 42, the conductive layers 51, 55 and so on of the circuit substrate 41.

Figure 17:
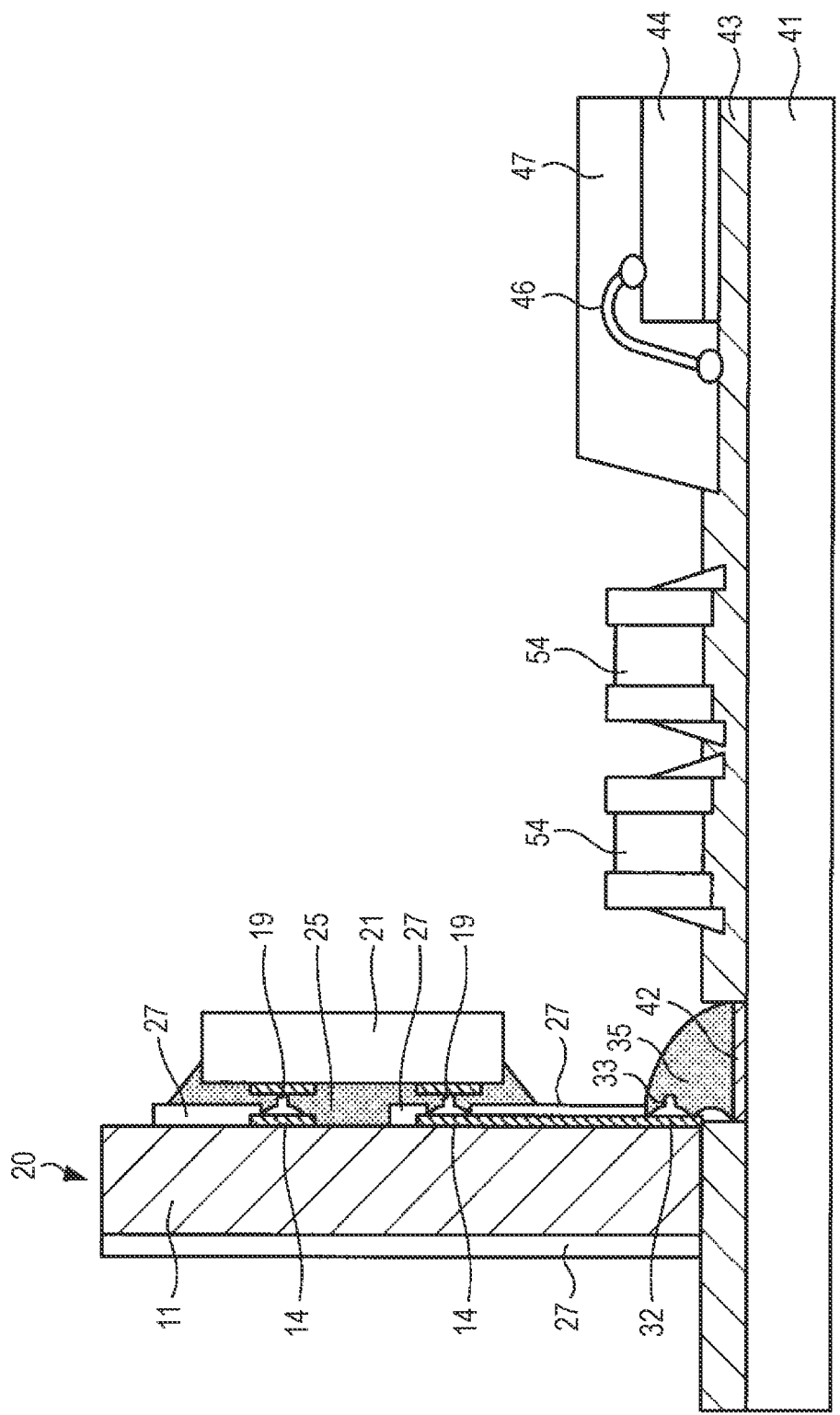
FIG. 17 is a view showing the structure of the optical communication device according to the embodiment.

In the optical communication device according to the embodiment, many wiring and connecting portions such as wiring and electrodes of the optical module 20 as well as wiring and electrodes of the circuit substrate 41 are added between the optical device 21 and the driving device 44 as described above. In the case of such structure, excessive parasitic capacitance and the like may be generated and waveform deterioration, signal loss and the like are liable to occur when transmitting high-speed electric signals. Accordingly, passive devices 54 for matching are provided on the wiring between the optical module 20 and the driving device 44 on the circuit substrate 41 as shown in FIG. 17. It is possible to correct a signal transmission waveform by providing the passive devices 54 for matching and additionally providing passive components such as an inductor, a capacitor, a resistor and so on in a high-speed signal line.

In the optical communication device 40, a shield case may be provided on an upper surface of the optical communication device 40 for protecting components or for reducing effects by high-frequency noise from the outside. It is further preferable to provide, for example, an electric connector on a rear face of the circuit substrate 41 instead of the input/output terminal 53 of the optical communication device 40.

The present disclosure may be implemented as the following configurations.

(1) An optical module including
a substrate provided with through holes for inserting optical fibers from a second principal surface side of the substrate, an optical device provided on a first principal surface of the substrate, first electrodes provided in the substrate for connecting electric fibers from the second principal surface side, second electrodes formed on the first principal surface side of the substrate for connecting to the optical device and third electrodes provided on a side surface of the substrate and electrically connected to the second electrodes.

(2) The optical module described in the above (1), in which the first electrodes are made of a conductive layer formed inside the through holes piercing through the substrate.

(3) The optical module described in the above (1), in which the first electrodes are made of the conductive layer formed on the second principal surface.

(4) The optical module described in the above (1), further including
fourth electrodes electrically connected to the second electrodes on the first principal surface and conductive bumps on the fourth electrodes.

(5) The optical module described in above (1), in which the through holes for inserting the optical fibers have a larger opening diameter in the second principal surface than in the first principal surface.

(6) A manufacturing method of an optical module including
forming through holes for inserting optical fibers and through holes for forming third electrodes in a substrate,
forming a conductive layer in the substrate and inside the through holes for forming the third electrodes, forming first electrodes for connecting the electric fibers and the second electrodes for connecting a optical device in the substrate and forming third electrodes provided so as to continue from the second electrodes inside the through holes for forming the third electrodes,
mounting the optical device on the second electrodes, and
cutting the substrate inside the through holes for forming the third electrodes to allow the third electrodes inside holes to be exposed on a side surface of the substrate.

(7) The manufacturing method of the optical module described in the above (6), further including
forming through holes for forming the first electrodes in the substrate and forming the first electrodes inside the through holes for forming the first electrodes in the process of forming the through holes for inserting optical fibers and through holes for forming third electrodes.

(8) The method of manufacturing the optical module described in the above (6), further including
forming fourth electrodes provided so as to continue from the second electrodes on the first principal surface of the substrate and forming conductive bumps on the fourth electrodes in the process of forming the second electrodes.

(9) The method of manufacturing the optical module described in the above (6),
in which the process of forming the through holes for inserting the optical fibers includes
a first etching process of forming through holes from a direction of the first principal surface of the substrate by anisotropic etching and a second etching process of widening openings of the through holes on the second principal surface from a direction of the second principal surface of the substrate by isotropic etching.

(10) An optical communication device including
an optical module described in the above (1),
a circuit substrate on which the optical module is mounted, and
a driving device for the optical device to be mounted on the circuit substrate.

(11) The optical communication device described in the above (10),
in which the optical module includes fourth electrodes electrically connected to the second electrodes on the first principal surface and conductive bumps on the fourth electrodes, the third electrodes and the conductive bumps are electrically connected to electrodes on the circuit substrate to mount the optical module on the circuit substrate.

(12) The optical communication device described in the above (10), further includes
a passive device provided between the optical device and the driving device on the circuit substrate.

The present disclosure contains subject matter related to that disclosed in Japanese Priority Patent Application JP 2011-085707 filed in the Japan Patent Office on Apr. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An optical module comprising:
a substrate having (i) a first principal surface and a second principal surface that are oppositely facing, and a side surface that is separate from the first and second principal surfaces, and (ii) one or more through holes extending through the substrate, the side surface being an outer surface of the substrate that is separate from inner surfaces of the one or more through holes,
wherein the one or more through holes include one or more first through holes configured to insert an optical fiber of a photoelectric composite cable, and one or more second through holes configured to insert one or more electric fibers of the photoelectric composite cable;
an optical device on a first principal surface side of the substrate;
a first electrode in or on the substrate,
wherein the first electrode is formed at inner surface of the one or more second through holes;
a second electrode on the first principal surface side of the substrate; and
a third electrode made of a conductive layer provided on inner surface of a concave portion formed on the side surface of the substrate and electrically connected to the second electrode.

2. The optical module according to claim 1, wherein:
the one or more through holes include two through holes, and
the first electrode is in the substrate, the first electrode being made of a conductive layer formed inside one of the two through holes.

3. The optical module according to claim 1, wherein the first electrode is on the substrate, the second electrode being made of a conductive layer formed on the first principal surface.

4. The optical module according to claim 1, further comprising:
a fourth electrode on the first principal surface and electrically connected to the second electrode; and
a conductive bump on the fourth electrode.

5. The optical module according to claim 1, wherein the one or more first through holes include a through hole that (i) is configured to insert the optical fiber through the through hole, and (ii) has an opening diameter in the second principal surface that is larger than that in the first principal surface.

6. An optical communication device comprising:
an optical module including
(a) a substrate having
(i) a first principal surface and a second principal surface that are oppositely facing, and a side surface that is separate from the first and second principal surfaces, and
(ii) one or more through holes extending through the substrate, the side surface being an outer surface of the substrate that is separate from inner surfaces of the one or more through holes,
wherein the one or more through holes include one or more first through holes configured to insert an optical fiber of a photoelectric composite cable, and one or more second through holes configured to insert one or more electric fibers of the photoelectric composite cable,
an optical device on a first principal surface side of the substrate,
a first electrode in or on the substrate, wherein the first electrode is formed at inner surface of the one or more second through holes,
a second electrode on the first principal surface side of the substrate, and a third electrode made of a conductive layer provided on inner surface of a concave portion formed on the side surface of the substrate and electrically connected to the second electrode;
(b) a circuit substrate on which the optical module is mounted; and
(c) a driving device for the optical device to be mounted on the circuit substrate.

7. The optical communication device according to claim 6, wherein the optical module further includes:
a fourth electrode on the first principal surface and electrically connected to the second electrode, and
a conductive bump on the fourth electrode.

8. The optical communication device according to claim 6, further comprising:
a passive device between the optical device and the driving device on the circuit substrate.

9. The optical module according to claim 1, wherein the one or more first through holes have a diameter smaller than the one or more second through holes.

10. The optical module according to claim 1, further comprising an insulating layer formed on the first principal surface, the second principal surface, the side surface, and the inner surface of the one or more second through holes.

11. The optical module according to claim 1, wherein the optical device is mounted on the substrate at a position such that a light emitting point or light receiving point of the optical device corresponds to a central position of the one or more first through holes.

* * * * *